(12) United States Patent
Igarashi et al.

(10) Patent No.: US 7,311,531 B2
(45) Date of Patent: Dec. 25, 2007

(54) ANISOTROPIC CONDUCTIVE CONNECTOR, CONDUCTIVE PASTE COMPOSITION, PROBE MEMBER, WAFER INSPECTION DEVICE AND WAFER INSPECTION METHOD

(75) Inventors: Hisao Igarashi, Tokyo (JP); Katsumi Sato, Tokyo (JP); Kazuo Inoue, Tokyo (JP)

(73) Assignee: JSR Corporation, Tokyo (JP)

( * ) Notice: Subject to any disclaimer, the term of this patent is extended or adjusted under 35 U.S.C. 154(b) by 5 days.

(21) Appl. No.: 10/548,832

(22) PCT Filed: Mar. 23, 2004

(86) PCT No.: PCT/JP2004/003931

§ 371 (c)(1),
(2), (4) Date: Sep. 13, 2005

(87) PCT Pub. No.: WO2004/086565

PCT Pub. Date: Oct. 7, 2004

(65) Prior Publication Data

US 2006/0211280 A1    Sep. 21, 2006

(30) Foreign Application Priority Data

Mar. 26, 2003  (JP) .............................. 2003-085092

(51) Int. Cl.
*H01R 4/58* (2006.01)
(52) U.S. Cl. ....................................................... 439/91
(58) Field of Classification Search ................... 439/91, 439/69–71; 361/212, 220; 324/765, 754
See application file for complete search history.

(56) References Cited

U.S. PATENT DOCUMENTS 6,604,953 B2    8/2003 Igarashi et al.
6,690,564 B1 *  2/2004 Haruta et al. ................ 361/212

(Continued)

FOREIGN PATENT DOCUMENTS

JP    2002-157918    5/2002

(Continued)

OTHER PUBLICATIONS

U.S. Appl. No. 10/548,832, filed Sep. 13, 2005, Igarashi et al.

(Continued)

*Primary Examiner*—J. F. Duverne
(74) *Attorney, Agent, or Firm*—Oblon, Spivak, McClelland, Maier & Neustadt, P.C.

(57) ABSTRACT

An anisotropically conductive connector, and applications thereof, by which good conductivity is retained over a long period of time even when it is used in electrical inspection of a plurality of integrated circuits formed on a wafer repeatedly over a great number of times, and thus high durability and long service life are achieved. The anisotropically conductive connector includes elastic anisotropically conductive films, in each of which a plurality of conductive parts for connection containing conductive particles and extending in a thickness-wise direction of the film are formed. The conductive particles contained in the conductive parts for connection in the anisotropically conductive connector are obtained by laminating surfaces of core particles exhibiting magnetism with a coating layer formed of a high-conductive metal, and the coating layer is a coating layer having a high hardness.

13 Claims, 14 Drawing Sheets

U.S. PATENT DOCUMENTS

| | | |
|---|---|---|
| 6,720,787 B2 * | 4/2004 | Kimura et al. ............... 324/765 |
| 6,849,335 B2 | 2/2005 | Igarashi et al. |
| 6,870,385 B2 | 3/2005 | Inoue et al. |
| 6,969,622 B1 | 11/2005 | Kokubo et al. |
| 7,095,241 B2 * | 8/2006 | Setaka et al. ............... 324/754 |
| 2005/0106907 A1 | 5/2005 | Yamada et al. |
| 2005/0272282 A1 | 12/2005 | Setaka et al. |

FOREIGN PATENT DOCUMENTS

| | | |
|---|---|---|
| JP | 2002-170608 | 6/2002 |
| JP | 2003-77559 | 3/2003 |

OTHER PUBLICATIONS

U.S. Appl. No. 10/560,347, filed Dec. 12, 2005, Yamada et al.
U.S. Appl. No. 10/552,995, filed Oct. 13, 2005, Sato et al.
U.S. Appl. No. 10/523,195, filed Jan. 27, 2005, Setaka.
U.S. Appl. No. 10/522,537, filed Jan. 27, 2005, Setaka et al.
U.S. Appl. No. 10/525,089, filed Feb. 23, 2005, Inoue et al.
U.S. Appl. No. 10/546,002, filed Aug. 18, 2005, Naoi.

* cited by examiner

ANISOTROPIC CONDUCTIVE CONNECTOR, CONDUCTIVE PASTE COMPOSITION, PROBE MEMBER, WAFER INSPECTION DEVICE AND WAFER INSPECTION METHOD

TECHNICAL FIELD

The present invention relates to an anisotropically conductive connector suitable for use in conducting electrical inspection of printed circuit boards, integrated circuit devices, integrated circuits formed on a wafer, liquid crystal panels, in which circuits have been formed, etc., a conductive paste composition for obtaining this anisotropically conductive connector, a probe member equipped with this anisotropically conductive connector, a wafer inspection apparatus equipped with this probe member, and a wafer inspection method using this probe member, and particularly to an anisotropically conductive connector suitable for use in conducting electrical inspection, such as a probe test or a burn-in test, as to integrated circuits formed on a wafer, a conductive paste composition for obtaining this anisotropically conductive connector, a probe member equipped with this anisotropically conductive connector, a wafer inspection apparatus equipped with this probe member, and a wafer inspection method using this probe member.

BACKGROUND ART

In the production process of semiconductor integrated circuit devices, after a great number of integrated circuits are formed on a wafer composed of, for example, silicon, a probe test for sorting defective integrated circuits is generally conducted as to each of these integrated circuit, by inspecting basic electrical properties. This probe test is conducted under a temperature environment of, for example, 85° C. This wafer is then cut, thereby forming semiconductor chips. Such semiconductor chips are contained and sealed in respective proper packages. Each of the packaged semiconductor integrated circuit devices is further subjected to a burn-in test that electrical properties thereof are inspected under a high-temperature environment of, for example, 125° C., thereby sorting semiconductor integrated circuit devices having latent defects.

In such electrical inspection of integrated circuits, such as probe test or burn-in test, a probe member is in use for electrically connecting each of electrodes to be inspected in an object of inspection to a tester. As such a probe member, is known a member composed of a circuit board for inspection, on which inspection electrodes have been formed in accordance with a pattern corresponding to a pattern of electrodes to be inspected, and an anisotropically conductive elastomer sheet arranged on this circuit board for inspection.

As such anisotropically conductive elastomer sheets, those of various structures have heretofore been known. For example, the following Prior Art. 1 or the like discloses an anisotropically conductive elastomer sheet (hereinafter referred to as "dispersion type anisotropically conductive elastomer sheet") obtained by dispersing conductive particles in an elastomer in a state oriented so as to align in a thickness-wise direction of the elastomer, and the following Prior Art. 2 or the like discloses an anisotropically conductive elastomer sheet (hereinafter referred to as "uneven distribution type anisotropically conductive elastomer sheet") obtained by unevenly distributing conductive particles in an elastomer in a state oriented so as to align in a thickness-wise direction of the elastomer, thereby forming a great number of conductive parts extending in the thickness-wise direction and an insulating part for mutually insulating them. Further, the following Prior Art. 3 or the like discloses an uneven distribution type anisotropically conductive elastomer sheet with a difference in level defined between the surface of the conductive part and an insulating part.

In the uneven distribution type anisotropically conductive elastomer sheet, since the conductive parts are formed in accordance with a pattern corresponding to a pattern of electrodes to be inspected of an integrated circuit to be inspected, it is advantageous compared with the dispersion type anisotropically conductive elastomer sheet in that electrical connection between electrodes can be achieved with high reliability even to an integrated circuit small in the arrangement pitch of electrodes to be inspected, i.e., center distance between adjacent electrodes to be inspected.

In such an anisotropically conductive elastomer sheet, since the conductive particles are oriented by application of a magnetic field so as to align in the thickness-wise direction upon the production of this anisotropically conductive elastomer sheet, it is necessary to use particles exhibiting magnetism as the conductive particles. In order to provide an anisotropically conductive elastomer sheet having high conductivity and permitting the conductivity to be retained for a long period of time, it is essential for the conductive particles to have high conductivity by themselves and be chemically stable over a long period of time. From such a point of view, particles obtained by forming a coating layer formed of gold on the surfaces of core particles composed of ferromagnetic substance such as nickel are used as the conductive particles.

By the way, in a probe test conducted for integrated circuits formed on a wafer, a method that a probe test is collectively performed on a group of integrated circuits composed of, for example, 16 or 32 integrated circuits among a great number of integrated circuits formed on a wafer, and the probe test is successively performed on other groups of integrated circuits has heretofore been adopted.

In recent years, there has been a demand for collectively performing a probe test on, for example, 64 or 128 integrated circuits among a great number of integrated circuits formed on a wafer, or all the integrated circuits for the purpose of improving inspection efficiency and reducing inspection cost.

In such a probe test, an anisotropically conductive elastomer sheet used in a probe member for conducting the probe test is required to have durability capable of withstanding repeated use of, for example, at least 50,000 times when wafers that are an object of inspection are mass-produced products.

In a conventional anisotropically conductive elastomer sheet, however, the conductivity of conductive parts thereof has been markedly deteriorated when it has been used in the probe test repeatedly, for example, 20,000 times or more, so that it has been unable to be used in subsequent tests, and so it has been required to be replaced by new one.

In a burn-in test on the other hand, it takes a long time to individually conduct electrical inspection of a great number of integrated circuit devices because each integrated circuit device, which is an object of inspection, is fine, and its handling is inconvenient, whereby inspection cost becomes considerably high. From such reasons, there has been proposed a WLBI (Wafer Level Burn-in) test in which the burn-in test is collectively performed on a great number of integrated circuits formed on a wafer in the state of the wafer.

In such a WLBI test, an anisotropically conductive elastomer sheet used in a probe member for conducting the WLBI test is required to have durability capable of withstanding repeated use of, for example, at least 500 times when wafers that are an object of inspection are mass-produced products.

In a conventional anisotropically conductive elastomer sheet, however, the conductivity of conductive parts thereof has been markedly deteriorated when it has been used in the WLBI test repeatedly, for example, 200 times or more, so that it has been unable to be used in subsequent tests, and so it has been required to be replaced by new one.

In, for example, a flip chip mounting method, semiconductor chips, in which a semi-spherical projected electrode composed of eutectic solder, lead-free solder, high-temperature solder (lead-rich solder) or the like has been formed on surface electrodes, are used. In order to obtain such semiconductor chips at high efficiency, it is conducted to form a projected electrode on electrodes in respective integrated circuits in a state of a wafer.

Thus, an anisotropically conductive elastomer sheet used in the probe test of a wafer is also required to have durability capable of withstanding repeated use over a great number of times even when the wafer, which is an object of inspection, has projected electrodes to be inspected.

In a conventional anisotropically conductive elastomer sheet, however, the conductivity of conductive parts thereof has been markedly deteriorated when it has been used in the probe test of wafers having projected electrodes to be inspected repeatedly, for example, 10,000 times or more, so that it has been unable to be used in subsequent tests, and so it has been required to be replaced by new one.

Prior Art. 1: Japanese Patent Application Laid-Open No. 93393/1976;

Prior Art. 2: Japanese Patent Application Laid-Open No. 147772/1978;

Prior Art. 3: Japanese Patent Application Laid-Open No. 250906/1986.

DISCLOSURE OF THE INVENTION

The present invention has been made on the basis of the foregoing circumstances and has as its first object the provision of an anisotropically conductive connector, by which good conductivity is retained over a long period of time even when it is used in electrical inspection of a plurality of integrated circuits formed on a wafer repeatedly over a great number of times, and thus high durability and long service life are achieved.

A second object of the present invention is to provide an anisotropically conductive connector, by which good conductivity is retained over a long period of time even when it is used in electrical inspection of a plurality of integrated circuits formed on a wafer repeatedly over a great number of times, and electrodes to be inspected of the integrated circuits formed on the wafer are projected electrodes, and thus high durability and long service life are achieved.

A third object of the present invention is to provide an anisotropically conductive connector, by which good conductivity is retained over a long period of time even when it is used in electrical inspection of a plurality of integrated circuits formed on a wafer repeatedly over a great number of times, and the electrical inspection is conducted under a high-temperature environment, and thus high durability and long service life are achieved.

A fourth object of the present invention is to provide an anisotropically conductive connector, by which good conductivity is retained over a long period of time even when it is used in direct contact with electrodes to be inspected of integrated circuits formed on a wafer repeatedly over a great number of times, and thus high durability and long service life are achieved, in addition to the above objects.

A fifth object of the present invention is to provide an anisotropically conductive connector, by which good conductivity is retained over a long period of time even when it is used in electrical inspection of circuit parts repeatedly over a great number of times, and the electrical inspection is conducted under a high-temperature environment, and thus high durability and long service life are achieved.

A sixth object of the present invention is to provide a conductive paste composition suitable for use in forming elastic anisotropically conductive films in the above-described anisotropically conductive connectors.

A seventh object of the present invention is to provide a probe member, by which good conductivity is retained over a long period of time even when it is used in electrical inspection of a plurality of integrated circuits formed on a wafer repeatedly over a great number of times, and thus high durability and long service life are achieved.

An eighth object of the present invention is to provide a wafer inspection apparatus and a wafer inspection method for conducting electrical inspection of a plurality of integrated circuits formed on a wafer in a state of the wafer using the above-described probe member.

The present inventors have carried out an extensive investigations repeatedly as to the cause of marked deterioration of the conductivity of conductive parts when an anisotropically conductive connector is used repeatedly. As a result, it has been found that since gold forming a coating layer in conductive particles is low in hardness as a metal, separation, abrasion, deformation and/or the like occurs on the coating layer in the conductive particles by contact between the conductive particles and contact between the conductive particles and an electrode to be inspected as the anisotropically conductive connector is used repeatedly, and consequently core particles composed of nickel or the like are exposed to the surface, thereby markedly deteriorating the conductivity of the conductive parts, and the present invention has been completed on the basis of this finding.

According to the present invention, there is provided an anisotropically conductive connector comprising an elastic anisotropically conductive film, in which a plurality of conductive parts for connection containing conductive particles and extending in a thickness-wise direction of the film have been formed, wherein the conductive particles contained in the conductive parts for connection are obtained by laminating a coating layer formed of a high-conductive metal on a surface of core particle exhibiting magnetism, and the coating layer is a coating layer having a high hardness.

According to the present invention, there is also provided an anisotropically conductive connector comprising an elastic anisotropically conductive film, in which a plurality of conductive parts for connection containing conductive particles and extending in a thickness-wise direction of the film have been formed, wherein the conductive particles contained in the conductive parts for connection are obtained by laminating a plurality of coating layers each formed of a high-conductive metal on a surface of core particle exhibiting magnetism, and the outermost coating layer among the plurality of the coating layers is a coating layer having a high hardness.

In the anisotropically conductive connectors according to the present invention, the Vickers hardness (HV) of the coating layer having the high hardness may preferably be at least 40.

The coating layer having the Vickers hardness (Hv) of at least 40 in the conductive particles may be formed of at least 2 high-conductive metals.

In such an anisotropically conductive connector, the coating layer having the Vickers hardness (Hv) of at least 40 in the conductive particles may preferably be formed of gold and another high-conductive metal.

The coating layer having the Vickers hardness (Hv) of at least 40 in the conductive particles may be formed by a sputtering method using an alloy composed of at least 2 high-conductive metals as a target.

The coating layer having the Vickers hardness (Hv) of at least 40 in the conductive particles may be formed by a plating treatment with a plating solution containing at least 2 high-conductive metal components.

In the anisotropically conductive connectors according to the present invention, it may be preferred that they have a frame plate, in which an anisotropically conductive film-arranging hole extending through in a thickness-wise direction has been formed, and the elastic anisotropically conductive film be arranged in the anisotropically conductive film-arranging hole of this frame plate and supported by the frame plate.

In the anisotropically conductive connectors according to the present invention, it may be preferred that when the anisotropically conductive connector is an anisotropically conductive connector used for conducting electrical inspection of each of a plurality of integrated circuits formed on a wafer in a state of the wafer, the anisotropically conductive connector comprises a frame plate, in which a plurality of anisotropically conductive film-arranging holes each extending in a thickness-wise direction have been formed corresponding to electrode regions, in which electrodes to be inspected have been formed, in the integrated circuits formed on the wafer, which is an object of inspection, and the elastic anisotropically conductive films be arranged in the respective anisotropically conductive film-arranging holes of this frame plate and supported by the frame plate.

According to the present invention, there is further provided a conductive paste composition comprising a polymer-forming material, which will become an elastic polymeric substance by being cured, and the conductive particles obtained above.

Such a conductive paste composition is suitable for forming the elastic anisotropically conductive film in the anisotropically conductive connector.

According to the present invention, there is still further provided a probe member suitable for use in conducting electrical inspection of each of a plurality of integrated circuits formed on a wafer in a state of the wafer, which comprises:

a circuit board for inspection, on the surface of which inspection electrodes have been formed in accordance with a pattern corresponding to a pattern of electrodes to be inspected of the integrated circuits formed on the wafer, which is an object of inspection, and the above-described anisotropically conductive connector arranged on the surface of the circuit board for inspection.

When the anisotropically conductive connector in the probe member according to the present invention is equipped with the frame plate, it may be preferable that the coefficient of linear thermal expansion of the frame plate in the anisotropically conductive connector be at most $3\times10^{-5}$/K, and the coefficient of linear thermal expansion of a base material making up the circuit board for inspection be at most $3\times10^{-5}$/K.

In the probe member according to the present invention, a sheet-like connector composed of an insulating sheet and a plurality of electrode structures each extending through in a thickness-wise direction of the insulating sheet and arranged in accordance with a pattern corresponding to the pattern of the electrodes to be inspected may be arranged on the anisotropically conductive connector.

According to the present invention, there is yet still further provided a wafer inspection apparatus for conducting electrical inspection of each of a plurality of integrated circuits formed on a wafer in a state of the wafer, which comprises:

the probe member described above, and wherein electrical connection to the integrated circuits formed on the wafer, which is an object of inspection, is achieved through the probe member.

According to the present invention, there is yet still further provided a wafer inspection method comprising electrically connecting each of a plurality of integrated circuits formed on a wafer to a tester through the probe member described above to perform electrical inspection of the integrated circuits formed on the wafer.

EFFECTS OF THE INVENTION

According to the anisotropically conductive connectors of the present invention, the conductive particles contained in the conductive parts for connection in the elastic anisotropically conductive films are obtained by forming a coating layer having a high hardness, for example, a Vickers hardness (Hv) of at least 40, so that occurrence of separation, abrasion, deformation and/or the like on the coating layer in the conductive particles by contact between the conductive particles, and the like is inhibited even when they are used repeatedly over a great number of times in electrical inspection of, for example, integrated circuits formed on wafer. As a result, necessary conductivity is retained over a long period of time, and thus high durability and long service life are achieved.

The coating layer is formed of gold and another high-conductive metal, whereby conductive parts for connection having high conductivity are obtained, and moreover the surfaces of the conductive particles are inhibited from being deteriorated even when the anisotropically conductive connector is used repeatedly over a great number of times under a high-temperature environment. As a result, necessary conductivity is retained over a long period of time, and thus high durability and long service life are achieved.

The frame plate for supporting the elastic anisotropically conductive films is provided, whereby the anisotropically conductive connectors are hard to be deformed and easy to handle, and the positioning and the holding and fixing to a wafer can be easily conducted in an electrically connecting operation to the wafer.

Since a frame plate, in which a plurality of anisotropically conductive film-arranging holes have been formed corresponding to electrode regions, in which electrodes to be inspected have been formed, of integrated circuits in a wafer, which is an object of inspection, is used as the frame plate, whereby the elastic anisotropically conductive film arranged in each of the anisotropically conductive film-arranging holes of the frame plate may be small in area, the individual elastic anisotropically conductive films are easy to be formed. In addition, since the elastic anisotropically conductive film small in area is little in the absolute quantity of thermal expansion in a plane direction of the elastic anisotropically conductive film even when it is subjected to thermal hysteresis, the thermal expansion of the elastic anisotropically conductive film in the plane direction is surely restrained by the frame plate by using a material having a low coefficient of linear thermal expansion as that for forming the frame plate. Accordingly, a good electrically connected state can be stably retained even when the probe test or wafer level burn-in test is performed on a large-area wafer.

According to the conductive paste composition of the present invention, the elastic anisotropically conductive films in the above-described anisotropically conductive connectors can be advantageously formed.

Since the probe members according to the present invention are equipped with any of the above-described anisotropically conductive connectors, good conductivity is retained over a long period of time even when they are used repeatedly over a great number of times, and thus high durability and long service life are achieved.

According to the wafer inspection apparatus and wafer inspection method of the present invention, the probe member having the anisotropically conductive connector high in durability and long in service life is used, so that the frequency to replace the anisotropically conductive connector by a new one can be lessened even when the inspection of wafers are conducted over great number of times, whereby the inspection of wafers can be conducted at high efficiency, and the inspection cost can be reduced.

| [Description of Characters] | | | |
|---|---|---|---|
| 1 | Probe member, | | |
| 2 | Anisotropically conductive connector, | | |
| 3 | Pressurizing plate, | 4 | Wafer mounting table, |
| 5 | Heater, | 6 | Wafer, |
| 7 | Electrodes to be inspected, | 10 | Frame plate, |
| 11 | Anisotropically conductive film-arranging holes, | | |

-continued

| | [Description of Characters] | | |
|---|---|---|---|
| 15 | Air circulating holes, | 16 | Positioning holes, |
| 20 | Elastic anisotropically conductive films, | | |
| 20A | Molding material layers, | 21 | Functional parts, |
| 22 | Conductive parts for connection, | | |
| 23 | Insulating part, | 24 | Projected parts, |
| 25 | Parts to be supported, | | |
| 26 | Conductive parts for non-connection, | | |
| 27 | Projected parts, | | |
| 30 | Circuit board for inspection, | | |
| 31 | Inspection electrodes, | | |
| 41 | Insulating sheet, | 40 | Sheet-like connector, |
| 42 | Electrode structures, | | |
| 43 | Front-surface electrode parts, | | |
| 44 | Back-surface electrode parts, | 45 | Short circuit parts, |
| 50 | Chamber, | 51 | Evacuation pipe, |
| 55 | O-rings, | | |
| 60 | Mold, | 61 | Top force, |
| 62 | Base plate, | 62a | Recessed parts, |
| 63, 63a, 63b | Ferromagnetic substance layers, | | |
| 64 | Non-magnetic substance layers, | | |
| 64a, 64b | Recessed parts, | | |
| 64c | First non-magnetic substance layers, | | |
| 64d | Second non-magnetic substance layers, | | |
| 65 | Bottom force, | 66 | Base plate, |
| 66a | Recessed parts, | | |
| 67, 67a, 67b | Ferromagnetic substance layers, | | |
| 68 | Non-magnetic substance layers, | | |
| 68a, 68b | Recessed parts, | | |
| 68c | First non-magnetic substance layers, | | |
| 68d | Second non-magnetic substance layers, | | |
| 69a, 69b | Spacers, | | |
| 71 | Cell, | 72 | Side wall material, |
| 73 | Lid material, | 73H | Through-hole, |
| 74 | Magnet, | 75 | Electrode part, |
| 76 | Electric resistance meter. | | |

BEST MODE FOR CARRYING OUT THE INVENTION

The embodiments of the present invention will hereinafter be described in details.

[Anisotropically Conductive Connector]

Figure 1:
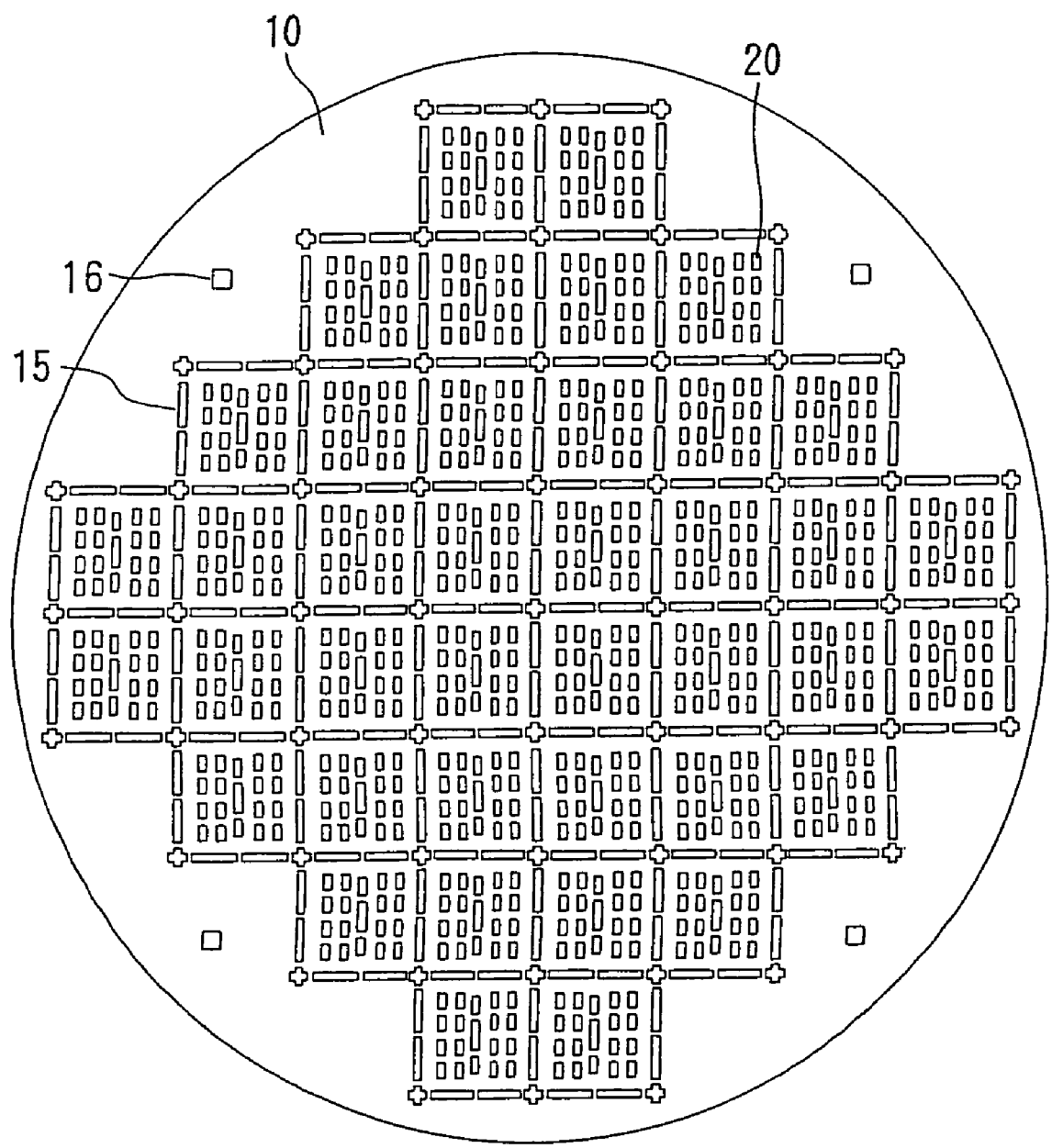
FIG. 1 is a plan view illustrating an exemplary anisotropically conductive connector according to the present invention.
Figure 2:
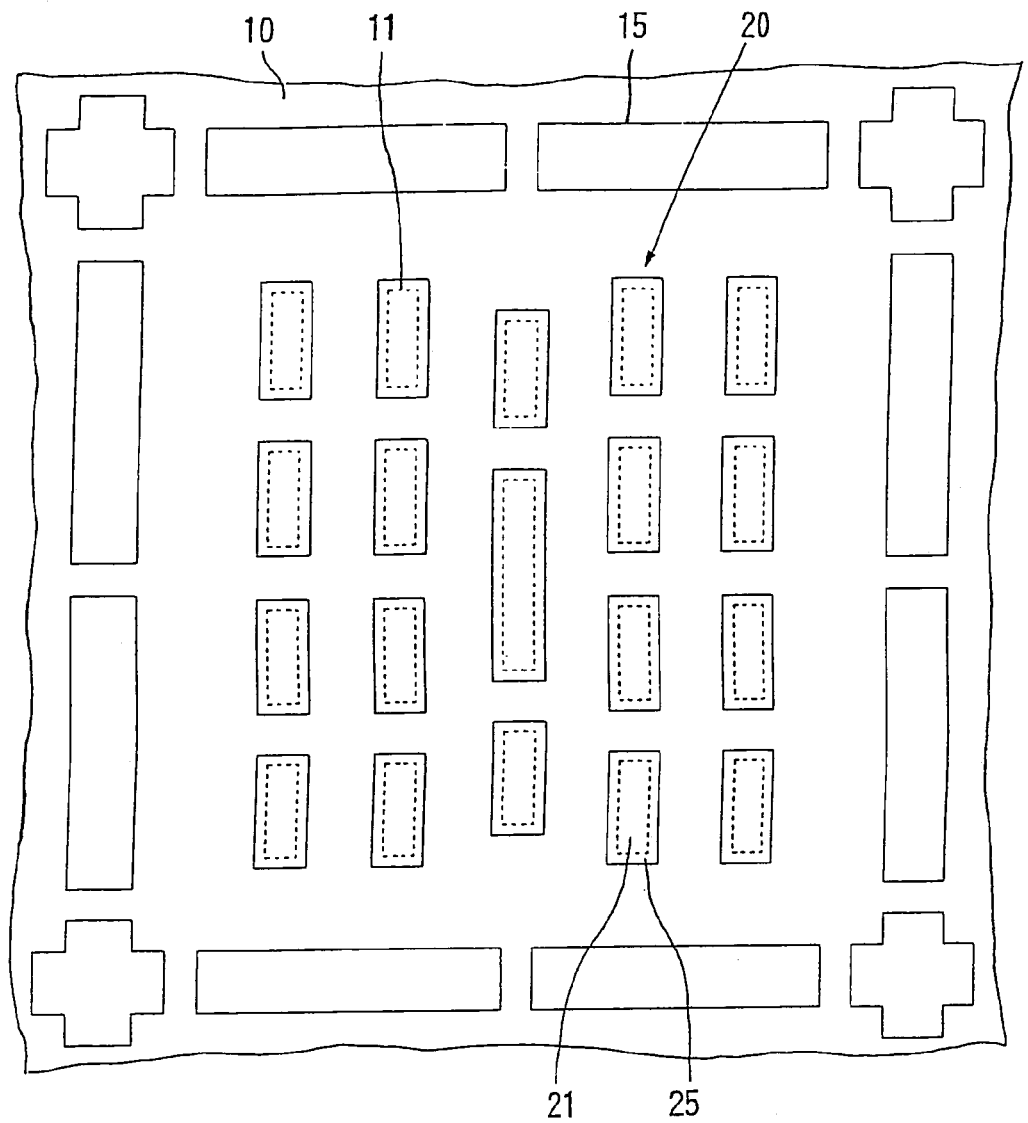
FIG. 2 is a plan view illustrating, on an enlarged scale, a part of the anisotropically conductive connector shown in FIG. 1.
Figure 3:
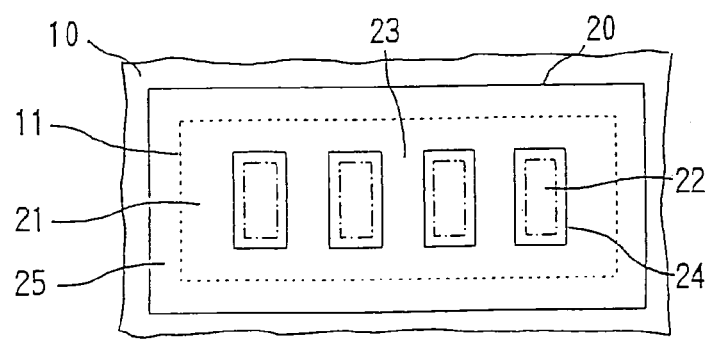
FIG. 3 is a plan view illustrating, on an enlarged scale, an elastic anisotropically conductive film in the anisotropically conductive connector shown in FIG. 1.
Figure 4:
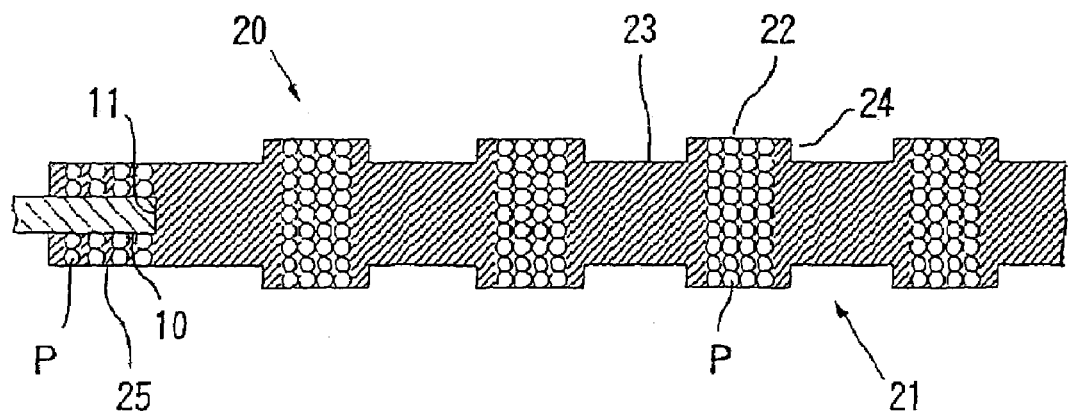
FIG. 4 is a cross-sectional view illustrating, on an enlarged scale, the elastic anisotropically conductive film in the anisotropically conductive connector shown in FIG. 1.

FIG. 1 is a plan view illustrating an exemplary anisotropically conductive connector according to the present invention, FIG. 2 is a plan view illustrating, on an enlarged scale, a part of the anisotropically conductive connector shown in FIG. 1, FIG. 3 is a plan view illustrating, on an enlarged scale, an elastic anisotropically conductive film in the anisotropically conductive connector shown in FIG. 1, and FIG. 4 is a cross-sectional view illustrating, on an enlarged scale, the elastic anisotropically conductive film in the anisotropically conductive connector shown in FIG. 1.

The anisotropically conductive connector shown in FIG. 1 is that used in conducting electrical inspection of each of, for example, a plurality of integrated circuits formed on a wafer in a state of the wafer and has a frame plate 10 in which a plurality of anisotropically conductive film-arranging holes 11 (indicated by broken lines) each extending through in a thickness-wise direction of the frame plate have been formed as illustrated in FIG. 2. The anisotropically conductive film-arranging holes 11 in this frame plate 10 are formed in accordance with a pattern of electrode regions, in which electrodes to be inspected have been formed in the integrated circuits formed on the wafer that is an object of inspection. Elastic anisotropically conductive films 20 having conductivity in the thickness-wise direction are arranged in the respective anisotropically conductive film-arranging holes 11 in the frame plate 10 in a state that they are each supported by the peripheral edge about the anisotropically conductive film-arranging hole 11 of the frame plate 10 and in a state independent of adjacent anisotropically conductive films 20 to each other. In the frame plate 10 of this embodiment, are formed air circulating holes 15 for circulating air between the anisotropically conductive connector and a member adjacent thereto when a pressurizing means of a pressure reducing system is used in a wafer inspection apparatus, which will be described subsequently. In addition, positioning holes 16 for positioning between the wafer, which is the object of inspection, and a circuit board for inspection are formed.

The elastic anisotropically conductive films 20 is formed by an elastic polymeric substance and, as illustrated in FIG. 3, has a functional part 21 composed of a plurality of conductive parts 22 for connection each extending in the thickness-wise direction (direction perpendicular to the paper in FIG. 3) of the film and an insulating part 23 formed around each of the conductive parts 22 for connection and mutually insulating these conductive parts 22 for connection. The functional part 21 is arranged so as to be located on the anisotropically conductive film-arranging hole 11 in the frame plate 10. The conductive parts 22 for connection in the functional part 21 are arranged in accordance with a pattern corresponding to a pattern of the electrodes to be inspected in the integrated circuit formed on the wafer, which is the object of inspection, and electrically connected to the electrodes to be inspected in the inspection of the wafer.

At a peripheral edge of the functional part 21, a part 25 to be supported, which is fixed to and supported by the periphery about the anisotropically conductive film-arranging hole 11 in the frame plate 10, is formed integrally and continuously with the functional part 21. More specifically, the part 25 to be supported in this embodiment is shaped in a forked form and fixed and supported in a closely contacted state so as to grasp the periphery about the anisotropically conductive film-arranging hole 11 in the frame plate 10.

In the conductive parts 22 for connection in the functional part 21 of the elastic anisotropically conductive film 20, conductive particles P exhibiting magnetism are contained at a high density in a state oriented so as to align in the thickness-wise direction as illustrated in FIG. 4. On the other hand, the insulating part 23 does not contain the conductive particles P at all or scarcely contain them. In this embodiment, the part 25 to be supported in the elastic anisotropically conductive film 20 contains the conductive particles P.

In the embodiment illustrated, projected parts 24 protruding from other surfaces than portions, at which the conductive parts 22 for connection and peripheries thereof are located, are formed at those portions on both sides of the functional part 21 in the elastic anisotropically conductive film 20.

The thickness of the frame plate 10 varies according to the material thereof, but is preferably 20 to 600 μm, more preferably 40 to 400 μm.

If this thickness is less than 20 μm, the strength required upon use of the resulting anisotropically conductive connector is not achieved, and the durability thereof is liable to be lowered. In addition, such stiffness as the form of the frame plate is retained is not achieved, and the handling property of the anisotropically conductive connector becomes low. If the thickness exceeds 600 μm on the other hand, the elastic anisotropically conductive films 20 formed in the anisotropically conductive film-arranging holes 11 become too great in thickness, and it may be difficult in some cases to achieve good conductivity in the conductive parts 22 for connection and insulating property between adjoining conductive parts 22 for connection.

The form and size in a plane direction of the anisotropically conductive film-arranging holes 11 in the frame plate 10 are designed according to the size, pitch and pattern of electrodes to be inspected in a wafer that is an object of inspection.

As a material for forming the frame plate 10, no particular limitation is imposed so far as it has such stiffness as the resulting frame plate 10 is hard to be deformed, and the form thereof is stably retained, and for example, various kinds of materials such as metallic materials, ceramic materials and resin materials may be used. When the frame plate 10 is formed by, for example, a metallic material, an insulating film may be formed on the surface of the frame plate 10.

Specific examples of the metallic material for forming the frame plate 10 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

Specific examples of the resin material forming the frame plate 10 include liquid crystal polymers and polyimide resins.

As the insulating film, may be used a fluororesin film, a polyimide resin film, a composite film containing a fluororesin or polyimide resin, or a metal oxide film.

The frame plate 10 may preferably exhibit magnetism at least at the peripheral portion about each of the anisotropically conductive film-arranging holes 11, i.e., a portion supporting the elastic anisotropically conductive film 20 in that the conductive particles P can be caused to be contained with ease in the part 25 to be supported in the elastic anisotropically conductive film 20 by a process which will be described subsequently. Specifically, this portion may preferably have a saturation magnetization of at least 0.1 Wb/m$^2$. In particular, the whole frame plate 10 may preferably be formed by a magnetic substance in that the frame plate 10 is easy to be produced.

Specific examples of the magnetic substance forming such a frame plate 10 include iron, nickel, cobalt, alloys of these magnetic metals, and alloys or alloy steels of these magnetic metals with any other metal.

When the resulting anisotropically conductive connector is used in the probe test or wafer level burn-in test, it is preferable to use a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K as a material for forming the frame plate 10.

Specific examples of such a material include invar alloys such as invar, Elinvar alloys such as Elinvar, and alloys or alloy steels of magnetic metals, such as superinvar, covar and 42 alloy.

The overall thickness (thickness of the conductive parts 22 for connection in the illustrated embodiment) of the elastic anisotropically conductive film 20 is preferably 50 to 3,000 μm, more preferably 70 to 2,500 μm, particularly preferably 100 to 2,000 μm. When this thickness is 50 μm or greater, elastic anisotropically conductive films 20 having sufficient strength are provided with certainty. When this thickness is 3,000 μm or less on the other hand, conductive parts 22 for connection having necessary conductive properties are provided with certainty.

In the embodiment illustrated, the projected parts 24 are formed on both surfaces of the elastic anisotropically conductive film 20, respectively, but may be formed on only one surface of the elastic anisotropically conductive film 20. The projected height of such projected part 24 is preferably at least 10% in total of the thickness in the projected part 24, more preferably at least 20%. Projected parts 24 having such a projected height are formed, whereby the conductive parts 22 for connection are sufficiently compressed by small pressurizing force, so that good conductivity is surely achieved.

The projected height of the projected part 24 is preferably at most 100%, more preferably at most 70% of the shortest width or diameter of the projected part 24. Projected parts 24 having such a projected height are formed, whereby the projected parts 24 are not buckled when they are pressurized, so that the expected conductivity is surely achieved.

The thickness (thickness of one of the forked portions in the illustrated embodiment) of the part 25 to be supported is preferably 5 to 600 μm, more preferably 10 to 500 μm, particularly preferably 20 to 400 μm.

It is not essential for the part 25 to be supported to be formed in the forked form, and it may be fixed to only one surface of the frame plate 10.

The elastic polymeric substance forming the anisotropically conductive films 20 is preferably a heat-resistant polymeric substance having a crosslinked structure. Various materials may be used as curable polymeric substance-forming materials usable for obtaining such a crosslinked polymeric substance. However, liquid silicone rubber is preferred.

The liquid silicone rubber may be any of addition type and condensation type. However, the addition type liquid silicone rubber is preferred. This addition type liquid silicone rubber is that cured by a reaction of a vinyl group with an Si—H bond and includes a one-pack type (one-component type) composed of polysiloxane having both vinyl group and Si-H bond and a two-pack type (two-component type) composed of polysiloxane having a vinyl group and polysiloxane having an Si—H bond. In the present invention, addition type liquid silicone rubber of the two-pack type is preferably used.

As the addition type liquid silicone rubber, is used that having a viscosity of preferably 100 to 1,000 Pa·s, more preferably 150 to 800 Pa·s, particularly preferably 250 to 500 Pa·s at 23° C. If this viscosity is lower than 100 Pa·s, precipitation of the conductive particles in such addition type liquid silicone rubber is easy to occur in a molding material for obtaining the elastic anisotropically conductive films 20, which will be described subsequently, so that good storage stability is not obtained. In addition, the conductive particles are not oriented so as to align in the thickness-wise direction of the molding material layer when a parallel magnetic field is applied to the molding material layer, so that it may be difficult in some cases to form a chain of the conductive particles in an even state. If this viscosity exceeds 1,000 Pa·s on the other hand, the viscosity of the resulting molding material becomes too high, so that it may be difficult in some cases to form the molding material layer in the mold. In addition, the conductive particles are not sufficiently moved even when a parallel magnetic field is applied to the molding material layer. Therefore, it may be difficult in some cases to orient the conductive particles so as to align in the thickness-wise direction.

The viscosity of such addition type liquid silicone rubber can be measured by means of a Brookfield type viscometer.

When the elastic anisotropically conductive films 20 are formed by a cured product (hereinafter referred to as "cured silicon rubber") of the liquid silicone rubber, the cured silicone rubber preferably has a compression set of at most 10%, more preferably at most 8%, still more preferably at most 6% at 150° C. If the compression set exceeds 10%, a chain of the conductive particles P in the conductive part 22 for connection is disordered when the resulting anisotropically conductive connector is used repeatedly under a high-temperature environment. As a result, it is difficult to retain the necessary conductivity.

In the present invention, the compression set of the cured silicone rubber can be measured by a method in accordance with JIS K 6249.

The cured silicone rubber forming the elastic anisotropically conductive films 20 preferably has a durometer A hardness of 10 to 60, more preferably 15 to 60, particularly preferably 20 to 60 at 23° C. If the durometer A hardness is lower than 10, the insulating part 23 mutually insulating the conductive parts 22 for connection is easily over-distorted when pressurized, and so it may be difficult in some cases to retain the necessary insulating property between the conductive parts 22 for connection. If the durometer A hardness exceeds 60 on the other hand, pressurizing force by a considerably heavy load is required for giving proper distortion to the conductive parts 22 for connection, so that, for example, a wafer, which is an object of inspection, tends to cause great deformation or breakage.

In the present invention, the durometer A hardness of the cured silicone rubber can be measured by a method in accordance with JIS K 6249.

Further, the cured silicone rubber for forming the elastic anisotropically conductive films 20 preferably has tear strength of at least 8 kN/m, more preferably at least 10 kN/m, still more preferably at least 15 kN/m, particularly preferably at least 20 kN/m at 23° C. If the tear strength is lower than 8 kN/m, the resulting elastic anisotropically conductive films 20 tend to deteriorate durability when they are distorted in excess.

In the present invention, the tear strength of the cured silicone rubber can be measured by a method in accordance with JIS K 6249.

As the addition type liquid silicone rubber having such properties, may be used that marketed as liquid silicone rubber "KE2000" series, "KE1950" series or "KE1990" series from Shin-Etsu Chemical Co., Ltd.

In the present invention, a proper curing catalyst may be used for curing the addition type liquid silicone rubber. As such a curing catalyst, may be used a platinum-containing catalyst. Specific examples thereof include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite with platinum, acetyl acetate-platinum chelates, and cyclic diene-platinum complexes.

The amount of the curing catalyst used is suitably selected in view of the kind of the curing catalyst and other curing treatment conditions. However, it is generally 3 to 15 parts by weight per 100 parts by weight of the addition type liquid silicone rubber.

In order to, for example, improve the thixotropic property of the addition type liquid silicone rubber, adjust the viscosity, improve the dispersion stability of the conductive particles or provide a base material having high strength, a general inorganic filler such as silica powder, colloidal silica, aerogel silica or alumina may be contained in the addition type liquid silicone rubber as needed.

No particular limitation is imposed on the amount of such an inorganic filler used. However, the use in a too large amount is not preferred because the orientation of the conductive particles by a magnetic field cannot be sufficiently achieved.

As the conductive particles P contained in the conductive parts 22 for connection and the parts 25 to be supported in each of the elastic anisotropically conductive films 20, are used particles obtained by forming one or more coating layers composed of a high-conductive metal on the surfaces of core particles (hereinafter also referred to as "magnetic core particles") exhibiting magnetism. The term "high-conductive metal" as used herein means a metal having an electric conductivity of at least $5 \times 10^6$ $\Omega^{-1}$ $m^{-1}$ at 0° C.

The magnetic core particles for obtaining the conductive particles P preferably have a number average particle diameter of 3 to 50 μm.

In the present invention, the number average particle diameter of the magnetic core particles means a value measured by a laser diffraction scattering method.

When the number average particle diameter is 3 μm or greater, conductive parts 22 for connection, which are easy to be deformed under pressure, low in resistance value and high in connection reliability can be easily obtained. When the number average particle diameter is 50 μm or smaller on the other hand, fine conductive parts 22 for connection can be easily formed, and the resultant conductive parts 22 for connection tend to have stable conductivity.

Further, the magnetic core particles preferably have a BET specific surface area of 10 to 1,500 m²/kg, more preferably 20 to 1,000 m²/kg, particularly preferably 50 to 500 m²/kg.

When the BET specific surface area is 10 m²/kg or wider, plating can be surely conducted on such magnetic core particles in a necessary amount because such magnetic core particles have a sufficiently wide area capable of being plated. Accordingly, conductive particles P high in conductivity can be obtained, and stable and high conductivity is achieved because a contact area between the conductive particles P is sufficiently wide. When the BET specific surface area is 1,500 m²/kg or smaller on the other hand, such magnetic core particles do not become brittle, so that they are seldom broken when physical stress is applied, and so stable and high conductivity is retained.

Further, the magnetic core particles preferably have a coefficient of variation of particle diameter of at most 50%, more preferably at most 40%, still more preferably at most 30%, particularly preferably at most 20%.

In the present invention, the coefficient of variation of particle diameter is a value determined in accordance with an expression: $(\sigma/Dn) \times 100$, wherein $\sigma$ is a standard deviation value of the particle diameter, and Dn is a number average particle diameter of the particles.

When the coefficient of variation of particle diameter is 50% or lower, conductive parts 22 for connection, which are narrow in scatter of conductivity, can be formed because the evenness of particle diameter is high.

As a material for forming the magnetic core particles, may be used iron, nickel, cobalt, a material obtained by coating copper or a resin with such a metal, or the like. However, those having a saturation magnetization of at least 0.1 Wb/m² may be preferably used. The saturation magnetization thereof is more preferably at least 0.3 Wb/m², particularly preferably 0.5 Wb/m². Specific examples of the material include iron, nickel, cobalt and alloys thereof.

When this saturation magnetization is at least 0.1 Wb/m², the conductive particles P can be easily moved in the molding material layers for forming the elastic anisotropically conductive films 20 by a process, which will be described subsequently, whereby the conductive particles P can be surely moved to portions to become conductive parts for connection in the respective molding material layers to form chains of the conductive particles P.

When the coating layer in the conductive particles P is composed of one layer in the present invention, such a coating layer has a high hardness of, for example, at least 40, preferably at least 50 in terms of a Vickers hardness (Hv). When the coating layer in the conductive particles P is composed of 2 or more layers, at least the outermost coating layer (hereinafter referred to as "surface coating layer") among them has a high hardness of, for example, at least 40, preferably at least 150 in terms of a Vickers hardness (Hv).

Such a coating layer may be formed by a single metal or 2 or more metals. When the coating layer is formed by 2 or more metals, it is not necessary to use only metals having a Vickers hardness (Hv) of at least 40, but the coating layer may be that formed of an alloy of a metal having a Vickers hardness (Hv) of at least 40 and another metal than such a metal, for example, gold or that having a phase-separation structure that a metal phase composed of a metal having a Vickers hardness (Hv) of at least 40 is dispersed in a metal phase composed of another metal than such a metal, for example, gold so far as the coating layer has a Vickers hardness (Hv) of at least 40 as a whole.

As the high-conductive metal having a Vickers hardness (Hv) of at least 40, may be used palladium, rhodium, ruthenium, iridium, platinum, tungsten, nickel, cobalt, chromium or an alloy thereof. Among these, palladium, rhodium, ruthenium, iridium and platinum may preferably be used in that they are chemically stable and have a high electric conductivity.

As the alloy of the metal having a Vickers hardness (Hv) of at least 40 and gold, may be used a gold-palladium alloy, a gold-copper alloy, a platinum-gold alloy, hard gold containing 0.1 to 1.0% of nickel or cobalt, or the like. Among these, the gold-palladium alloy and the hard gold containing 0.1 to 1.0% of nickel or cobalt may preferably be used in that they are chemically stable and have a high electric conductivity.

In the conductive particles having the coating layer of 2 or more layers, no particular limitation is imposed on the metal forming any other coating layer (hereinafter referred to as "intermediate coating layer") than the surface coating layer. However, silver, copper and gold may preferably be used in that they have exceptionally high conductivity, with gold being particularly preferred in that it is chemically stable.

In the conductive particles P, a proportion [(mass of coating layer/mass of core particles)×100] of the mass (in the case where the conductive particles have the coating layer of 2 or more layers, a total mass thereof) of the coating layer to the mass of the core particles is preferably at least 15% by mass, more preferably 25 to 35% by mass.

If the proportion of the mass of the coating layer is lower than 15% by mass, the conductivity of such conductive particles P is markedly deteriorated when the resulting anisotropically conductive connector is used repeatedly under a high-temperature environment, and so it may be difficult in some cases to retain the necessary conductivity.

In the conductive particles P, the thickness t of the coating layer, which is calculated out in accordance with the following equation, is preferably at least 40 nm, more preferably 100 to 200 nm.

$$t = [1/(Sw \cdot \rho)] \times [N/(1-N)]$$

wherein t is the thickness (m) of the coating layer, Sw is a BET specific surface area (m²/kg) of the core particles, $\rho$ is a specific gravity (kg/m³) of the metal forming the coating layer, and N is a value of (mass of the coating layer/total mass of the conductive particles).

The above-described equation is derived in the following manner.

(a) Supposing that the weight of the magnetic core particles is Mp (kg), the surface area S (m²) of the magnetic core particles is determined by:

$$S = Sw \cdot Mp \qquad \text{Equation (1)}$$

(b) Supposing that the mass of the coating layer is m (kg), the volume (V) of the coating layer is determined by:

$$V = m/\rho \qquad \text{Equation (2)}$$

(c) Assuming that the thickness of the coating layer is even over all the surfaces of the conductive particles, t = V/S. When the equations (1) and (2) are substituted into this equation, the thickness t of the coating layer is determined by:

$$t = (m/\rho)/(Sw \cdot Mp) = m/(Sw \cdot \rho \cdot Mp) \qquad \text{Equation (3)}$$

(d) Since N is a ratio of the mass of the coating layer to the total mass of the conductive particles, the value of N is determined by:

$$N=m/(Mp+m) \qquad \text{Equation (4)}$$

(e) A numerator and a denominator in the right side of the equation (4) are divided by Mp to give $$N=(m/Mp)/(1+m/Mp).$$

Multiply both sides by (1+m/Mp), and the product is N(1+m/Mp)=m/Mp, and in its turn, N+N(m/Mp)=m/Mp. When N(m/Mp) is shifted to the right side, N=m/Mp−N(m/Mp)=(m/Mp)(1−N) is given. Divide both sides by (1−N), and N/(1−N)=m/Mp is given.

Accordingly, the mass Mp of the magnetic core particles is determined by:

$$Mp=m/[N/(1-N)]=m(1-N)/N \qquad \text{Equation (5)}$$

(f) When the equation (5) is substituted into the equation (3), $$t=1/[Sw \cdot \rho \cdot (1-N)/N]=[1/(Sw \cdot \rho)] \times [N/(1-N)] \text{ is derived.}$$

When this thickness t of the coating layer is at least 40 nm, the conductivity of such conductive particles P is not markedly lowered, in the case where the resulting anisotropically conductive connector is used repeatedly under a high-temperature environment, because the high-conductive metal exists in a high proportion on the surfaces of the conductive particles P even when the substance forming the magnetic core particles and the substance forming the electrodes to be inspected migrate into the coating layer. Thus, the expected conductivity is retained.

The BET specific surface area of the conductive particles P is preferably 10 to 1,500 $m^2$/kg.

When this BET specific surface area is 10 $m^2$/kg or wider, the surface area of the coating layer becomes sufficiently wide, so that the coating layer great in the overall weight of the high-conductive metal can be formed. Accordingly, particles high in conductivity can be provided. In addition, stable and high conductivity can be achieved because a contact area among the conductive particles P is sufficiently wide. When this BET specific surface area is 1,500 $m^2$/kg or smaller on the other hand, such conductive particles do not become brittle, and thus they are not broken even when physical stress is applied thereto, and so the stable and high conductivity is retained.

The number average particle diameter of the conductive particles P is preferably 3 to 50 μm, more preferably 6 to 15 μm.

Such conductive particles P are used, whereby the resulting elastic anisotropically conductive films 20 become easy to be deformed under pressure. In addition, sufficient electrical contact is achieved between the conductive particles P in the conductive parts 22 for connection in the elastic anisotropically conductive films 20.

No particular limitation is imposed on the shape of the conductive particles P. However, they are preferably in the shape of a sphere or star, or lump by secondary particles obtained by aggregating these particles from the viewpoint of permitting easy dispersion of these particles in the polymeric substance-forming material.

With respect to the conductive particles P, the electric resistance value R, which will be described subsequently, is preferably at most 0.3 Ω, more preferably at most 0.1 Ω.

Electric resistance value R: an electric resistance value determined by preparing a paste composition by kneading 6 g of the conductive particles and 8 g of liquid rubber, arranging this paste composition between a pair of electrodes arranged at a clearance of 0.5 mm so as to oppose to each other and each having a diameter of 1 mm, applying a magnetic field of 0.3 T between the pair of the electrodes, and leaving those to stand in this state until the electric resistance value between the pair of the electrodes becomes stable.

Specifically, the electric resistance value R is measured in the following manner.

Figure 5:
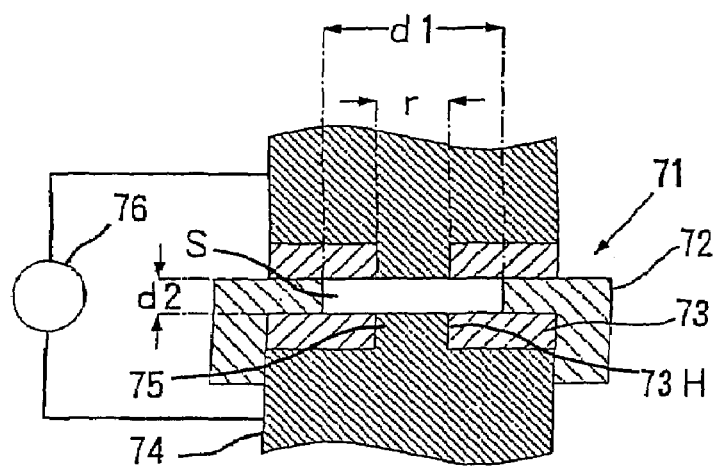
FIG. 5 is a cross-sectional view illustrating the construction of an apparatus for measuring an electric resistance value R.

FIG. 5 illustrates an apparatus for measuring an electric resistance value R. Reference numeral 71 indicates a ceramic cell in which a sample chamber S is formed, and the cell is constructed by a cylindrical side wall material 72 and a pair of lid members 73 each having a through-hole 73H at its center. Reference numeral 74 designates a pair of conductive magnets each having an electrode part 75, which is in the form protruding from the surface thereof and fitted to the through-hole 73H in the lid member 73. Each magnet is fixed to the lid member 73 in a state that the electrode part 75 has been fitted into the through-hole 73H in the lid member 73. Reference numeral 76 indicates an electric resistance meter connected to each of the pair of the magnets 74. The sample chamber S of the cell 71 is in the form of a disk having a diameter d1 of 3 mm and a thickness d2 of 0.5 mm, and the inner diameter of the through-hole 73H in the lid member 73, i.e., the diameter r of the electrode part 75 of the magnet 74 is 1 mm.

The paste composition described above is filled into the sample chamber S of the cell 71, and an electric resistance value between the electrodes 75 of the magnets 74 is measured by the electric resistance meter 76 while applying a parallel magnetic field of 0.3 T between the electrodes 75 of the magnets 74 in the thickness-wise direction of the sample chamber S. As a result, the conductive particles dispersed in the paste composition are gathered between the electrodes 75 of the magnets 74 by the effect of the parallel magnetic field and oriented so as to align in the thickness-wise direction. With the movement of the conductive particles, the electric resistance value between the electrodes 75 of the magnets 74 lowers and then becomes a stable state, thereby measuring an electric resistance value at this time. The duration of time from the time the parallel magnetic field has been applied to the paste composition up to the time the electric resistance value between the electrodes 75 of the magnets 74 has reached the stable state varies according to the kind of the conductive particles. However, an electric resistance value after 500 seconds have elapsed from the application of the parallel magnetic field to the paste composition is generally measured as the electric resistance value R.

When the electric resistance value R is at most 0.3 Ω, conductive parts 22 for connection having high conductivity can be surely obtained.

The water content in the conductive particles P is preferably at most 5% by mass, more preferably at most 3% by mass, still more preferably at most 2% by mass, particularly preferably at most 1% by mass. By satisfying such conditions, occurrence of bubbles is prevented or inhibited upon a curing treatment in the preparation of the molding material or the formation of the elastic anisotropically conductive films 20.

The conductive particles P may be those treated with a coupling agent such as a silane coupling agent on surfaces thereof. By treating the surfaces of the conductive particles P with the coupling agent, the adhesion property of the conductive particles P to the elastic polymeric substance is enhanced. As a result, a conductive material high in durability is obtained.

The amount of the coupling agent used is suitably selected within limits not affecting the conductivity of the conductive particles P. However, it is preferably such an amount that a coating rate (proportion of an area coated with the coupling agent to the surface area of the conductive particles) of the coupling agent on the surfaces of the conductive particles P amounts to at least 5%, more preferably 7 to 100%, still more preferably 10 to 100%, particularly preferably 20 to 100%.

Such conductive particles P may be obtained in accordance with, for example, the following process.

Particles are first formed from a ferromagnetic material in accordance with a method known per se in the art, or commercially available particles of a ferromagnetic substance are provided. The particles are subjected to a classification treatment to prepare magnetic core particles having a necessary particle diameter.

In the present invention, the classification treatment of the particles can be conducted by means of, for example, a classifier such as an air classifier or sonic classifier.

Specific conditions for the classification treatment are suitably preset according to the intended number average particle diameter of the magnetic core particles, the kind of the classifier, and the like.

The magnetic core particles are then subjected to a surface oxide film-removing treatment and further to a surface-washing treatment with, for example, purified water, thereby removing impurities such as dirt, foreign matter and oxide films, which are present on the surfaces of the magnetic core particles. After the magnetic core particles are then subjected to an anti-oxidizing treatment as needed, a coating layer composed of the high-conductive metal is formed on the surfaces of the magnetic core particles. The thus-treated particles are further subjected to a classification treatment as needed, thereby obtaining conductive particles. As a specific method of the surface oxide film-removing treatment for the magnetic core particles, may be used a treatment method with an acid such as hydrochloric acid.

As a specific method of the anti-oxidizing treatment for the magnetic core particles, may be used a treatment method with water-soluble fullerene or the like.

No particular limitation is imposed on the process for forming the coating layer, and various processes may be used. For example, a wet process, such as an electroless plating process such as a displacement plating process or chemical reduction plating process, or an electroplating process, or a dry process such as a sputtering process or vapor deposition process may be used. Among these, the electroless plating process, electroplating process and sputtering process may preferably be used.

A process for forming the coating layer by the electroless plating process such as the chemical reduction plating process or displacement plating process will be described. The magnetic core particles subjected to the acid treatment and washing treatment are first added to a plating solution to prepare a slurry, and electroless plating on the magnetic core particles is conducted while stirring the slurry. The particles in the slurry are then separated from the plating solution. Thereafter, the particles separated are subjected to a washing treatment with, for example, purified water, thereby obtaining conductive particles with a coating layer composed of the high-conductive metal formed on the surfaces of the magnetic core particles.

When 2 or more coating layers are formed, it is preferred that an intermediate coating layer be formed on the surfaces of the magnetic core particles by, for example, the electroless plating process, and a surface coating layer be then formed on the surface of the intermediate coating layer by electroplating process.

No particular limitation is imposed on the plating solution used in the electroless plating process, and various kinds of commercially available plating solutions may be used.

Since conductive particles having a great particle diameter may be produced due to aggregation of the magnetic core particles upon the coating of the surfaces of the particles with the high-conductive metal, the resultant conductive particles are preferably subjected to a classification treatment as needed. By the classification treatment, conductive particles having the expected particle diameter can be surely obtained.

As examples of a classifier used for conducting the classification treatment for the conductive particles, may be mentioned those exemplified as the classifier used in the classification treatment for preparing the magnetic core particles.

A proportion of the conductive particles P contained in the conductive parts 22 for connection in the functional part 21 is preferably 10 to 60%, more preferably 15 to 50% in terms of volume fraction. If this proportion is lower than 10%, it may be impossible in some cased to obtain conductive parts 22 for connection sufficiently low in electric resistance value. If this proportion exceeds 60% on the other hand, the resulting conductive parts 22 for connection are liable to be brittle, so that elasticity required of the conductive parts 22 for connection may not be achieved in some cases.

A proportion of the conductive particles P contained in the parts 25 to be supported varies according to the content of the conductive particles in the molding material for forming the elastic anisotropically conductive films 20. However, it is preferably equivalent to or higher than the proportion of the conductive particles contained in the molding material in that the conductive particles P are surely prevented from being contained in excess in the conductive parts 22 for connection located most outside among the conductive parts 22 for connection in the elastic anisotropically conductive film 20. It is also preferably at most 30% in terms of volume fraction in that parts 25 to be supported having sufficient strength are provided.

The anisotropically conductive connector described above may be produced, for example, in the following manner.

A frame plate 10 composed of a magnetic metal, in which anisotropically conductive film-arranging holes 11 have been formed corresponding to a pattern of electrode regions, in which electrodes to be inspected have been arranged, of integrated circuits in a wafer, which is an object of inspection, is first produced. As a method for forming the anisotropically conductive film-arranging holes 11 in the frame plate 10, may be used, for example, an etching method or the like.

Figure 6:
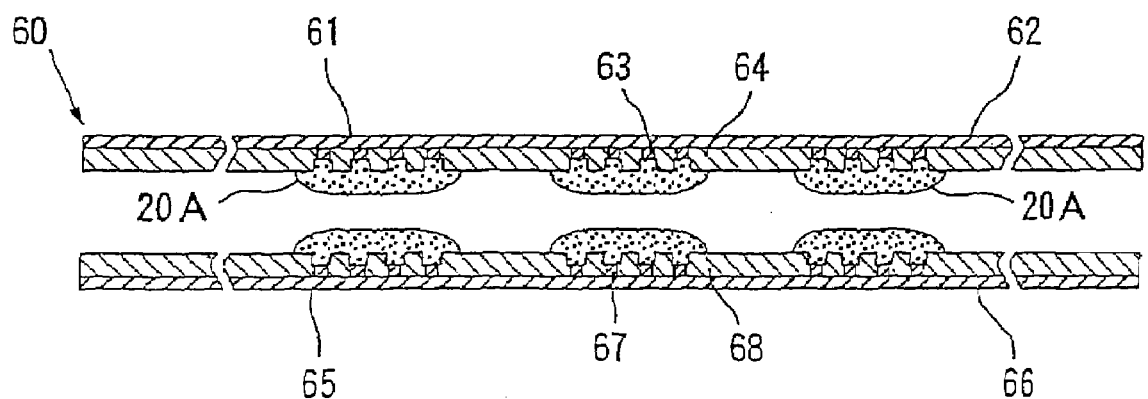
FIG. 6 is a cross-sectional view illustrating a state that a molding material has been applied to a mold for molding elastic anisotropically conductive films to form molding material layers.

A conductive paste composition with the above-described conductive particles dispersed in a polymer-forming material, which will become an elastic polymeric substance by being cured, is then prepared. As illustrated in FIG. 6, a mold 60 for molding elastic anisotropically conductive films is provided, and the conductive paste composition as a molding material for elastic anisotropically conductive films is applied to the respective molding surfaces of a top force 61 and a bottom force 65 in the mold 60 in accordance with a necessary pattern, i.e., an arrangement pattern of elastic anisotropically conductive films to be formed, thereby forming molding material layers 20A.

The mold 60 will be described specifically. This mold 60 is constructed by arranging the top force 61 and the bottom force 65 making a pair therewith so as to oppose to each other.

Figure 7:
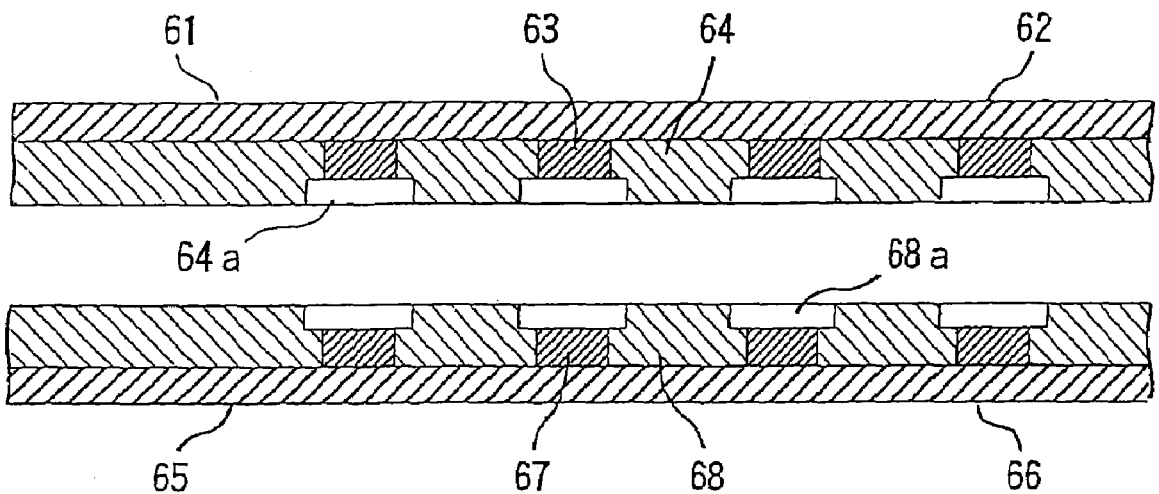
FIG. 7 is a cross-sectional view illustrating, on an enlarged scale, a part of the mold for molding elastic anisotropically conductive films.

In the top force 61, as illustrated on an enlarged scale in FIG. 7, ferromagnetic substance layers 63 are formed on a lower surface of a base plate 62 in accordance with a pattern antipodal to an arrangement pattern of conductive parts 22 for connection in elastic anisotropically conductive films 20 to be molded, and a non-magnetic substance layer 64 is formed at another portion than the ferromagnetic substance layers 63. The molding surface is formed by these ferromagnetic substance layers 63 and non-magnetic substance layer 64. Recessed parts 64a are formed in the molding surface of the top force 61 corresponding to the projected parts 24 in the elastic anisotropically conductive films 20 to be molded.

In the bottom force 65 on the other hand, ferromagnetic substance layers 67 are formed on an upper surface of a base plate 66 in accordance with the same pattern as the arrangement pattern of the conductive parts 22 for connection in the elastic anisotropically conductive films 20 to be molded, and a non-magnetic substance layer 68 is formed at another portion than the ferromagnetic substance layers 67. The molding surface is formed by these ferromagnetic substance layers 67 and non-magnetic substance layer 68. Recessed parts 68a are formed in the molding surface of the bottom force 65 corresponding to the projected parts 24 in the elastic anisotropically conductive films 20 to be molded.

The respective base plates 62 and 66 in the top force 61 and bottom force 65 are preferably formed by a ferromagnetic substance. Specific examples of such a ferromagnetic substance include ferromagnetic metals such as iron, iron-nickel alloys, iron-cobalt alloys, nickel and cobalt. The base plates 62, 66 preferably have a thickness of 0.1 to 50 mm, and surfaces thereof are preferably smooth and subjected to a chemical degreasing treatment and/or mechanical polishing treatment.

As a material for forming the ferromagnetic substance layers 63, 67 in both top force 61 and bottom force 65, may be used a ferromagnetic metal such as iron, iron-nickel alloy, iron-cobalt alloy, nickel or cobalt. The ferromagnetic substance layers 63, 67 preferably have a thickness of at least 10 μm. When this thickness is at least 10 μm, a magnetic field having a sufficient intensity distribution can be applied to the molding material layers 20A. As a result, the conductive particles can be gathered at a high density to portions to become conductive parts 22 for connection in the molding material layers 20A, and so conductive parts 22 for connection having good conductivity can be provided.

As a material for forming the non-magnetic substance layers 64, 68 in both top force 61 and bottom force 65, may be used a non-magnetic metal such as copper, a polymeric substance having heat resistance, or the like. However, a polymeric substance cured by radiation may preferably be used in that the non-magnetic substance layers 64, 68 can be easily formed by a technique of photolithography. As a material thereof, may be used, for example, a photoresist such as an acrylic type dry film resist, epoxy type liquid resist or polyimide type liquid resist.

As a method for applying the molding material to the molding surfaces of the top force 61 and bottom force 65, may preferably be used a screen printing method. According to such a method, the molding material can be easily applied according to a necessary pattern, and a proper amount of the molding material can be applied.

Figure 8:
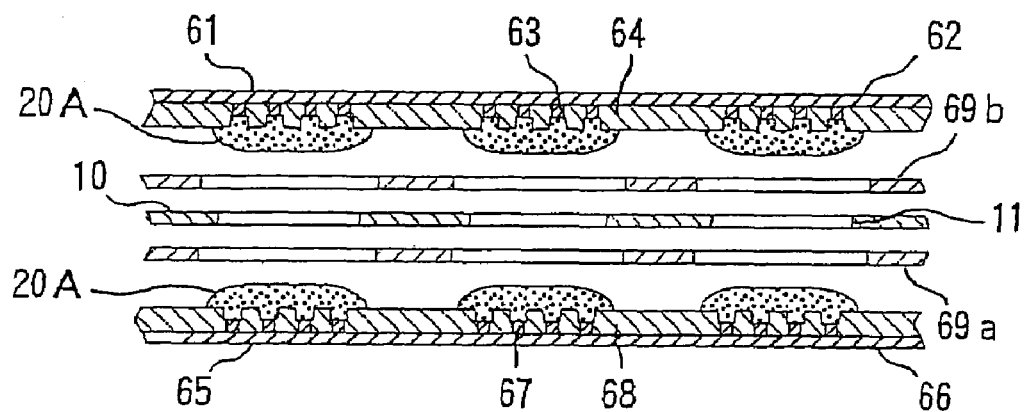
FIG. 8 is a cross-sectional view illustrating a state that a frame plate has been arranged through spacers between a top force and a bottom force in the mold shown in FIG. 6.
Figure 9:
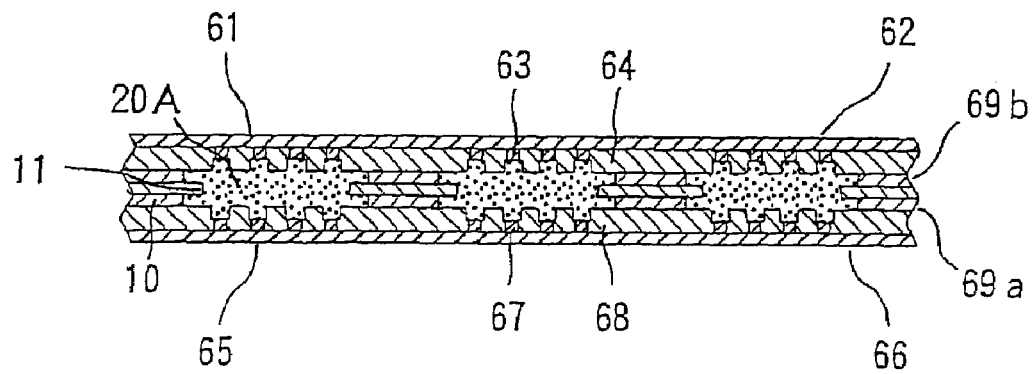
FIG. 9 is a cross-sectional view illustrating a state that molding material layers of the intended form have been formed between the top force and the bottom force in the mold.
Figure 10:
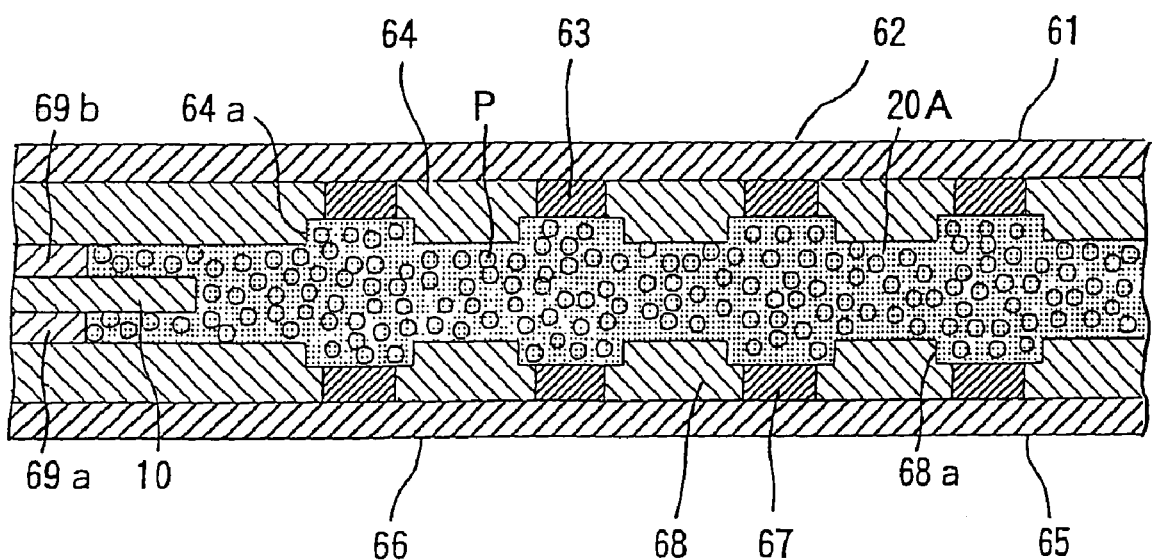
FIG. 10 is a cross-sectional view illustrating, on an enlarged scale, the molding material layer shown in FIG. 9.

As illustrated in FIG. 8, the frame plate 10 is then arranged in alignment on the molding surface of the bottom force 65, on which the molding material layers 20A have been formed, through a spacer 69a, and on the frame plate 10, the top force 61, on which the molding material layers 20A have been formed, is arranged in alignment through a spacer 69b. These top and bottom forces are superimposed on each other, whereby molding material layers 20A of the intended form (form of the elastic anisotropically conductive films 20 to be formed) are formed between the top force 61 and the bottom force 65 as illustrated in FIG. 9. In these molding material layers 20A, the conductive particles P are contained in a state dispersed throughout in the molding material layer 20A as illustrated in FIG. 10.

As described above, the spacers 69a and 69b are arranged between the frame plate 10, and the bottom force 65 and the top force 61, respectively, whereby the elastic anisotropically conductive films of the intended form can be formed, and adjoining elastic anisotropically conductive films are prevented from being connected to each other, so that a great number of anisotropically conductive films independent of one another can be formed with certainty.

Figure 11:
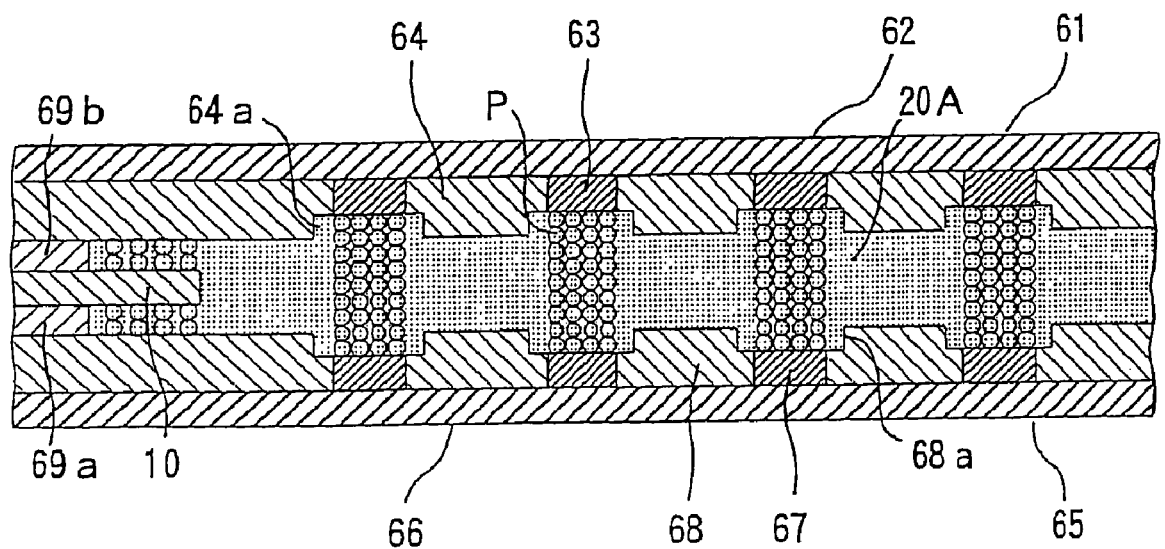
FIG. 11 is a cross-sectional view illustrating a state that a magnetic field having an intensity distribution has been applied to the molding material layer shown in FIG. 10 in a thickness-wise direction thereof.

A pair of, for example, electromagnets are then arranged on the upper surface of the base plate 62 in the top force 61 and the lower surface of the base plate 66 in the bottom force 65, and the electromagnets are operated, whereby a magnetic field having higher intensity at portions between the ferromagnetic substance layers 63 of the top force 61 and their corresponding ferromagnetic substance layers 67 of the bottom force 65 than surrounding regions thereof is formed because the top force 61 and bottom force 65 have the ferromagnetic substance layers 63 and 67, respectively. As a result, in the molding material layers 20a, the conductive particles P dispersed in the molding material layers 20A are gathered to portions to become the conductive parts 22 for connection, which are located between the ferromagnetic substance layers 63 of the top force 61 and their corresponding ferromagnetic substance layers 67 of the bottom force 65, and oriented so as to align in the thickness-wise direction of the molding material layers as illustrated in FIG. 11. In the above-described process, since the frame plate 10 is composed of the magnetic metal, a magnetic field having higher intensity at portions between the top force 61 and the bottom force 65, and the frame plate 10 than vicinities thereof is formed. As a result, the conductive particles P existing above and below the frame plate 10 in the molding material layers 20A are not gathered between the ferromagnetic substance layers 63 of the top force 61 and the ferromagnetic substance layers 67 of the bottom force 65, but remain retained above and below the frame plate 10.

In this state, the molding material layers 20A are subjected to a curing treatment, whereby the elastic anisotropically conductive films 20 each composed of a functional part 21, in which a plurality of conductive parts 22 for connection containing the conductive particles P in the elastic polymeric substance in a state oriented so as to align in the thickness-wise direction are arranged in a state mutually insulated by an insulating part 23 composed of the elastic polymeric substance, in which the conductive particles P are not present at all or scarcely present, and a part 25 to be supported, which is continuously and integrally formed at a peripheral edge of the functional part 21 and in which the conductive particles P are contained in the elastic polymeric substance, are formed in a state that the part 25 to be supported has been fixed to the periphery about each anisotropically conductive film-arranging hole 11 of the frame plate 10, thus producing an anisotropically conductive connector.

In the above-described process, the intensity of the external magnetic field applied to the portions to become the conductive parts 22 for connection and the portions to become the parts 25 to be supported in the molding material layers 20A is preferably an intensity that it amounts to 0.1 to 2.5 T on the average.

The curing treatment of the molding material layers 20A is suitably selected according to the material used. However, the treatment is generally conducted by a heating treatment. When the curing treatment of the molding material layers 20A is conducted by heating, it is only necessary to provide a heater to an electromagnet. Specific heating temperature and heating time are suitably selected in view of the kinds of the polymeric substance-forming material for forming the molding material layers 20A, and the like, the time required for movement of the conductive particles P, and the like.

According to the above-described anisotropically conductive connector, the conductive particles P contained in the conductive parts 22 for connection in the elastic anisotropically conductive films 20 are obtained by forming a coating layer having a Vickers hardness (Hv) of at least 40, so that occurrence of separation, abrasion, deformation and/or the like on the coating layer in the conductive particles P by contact between the conductive particles P, and the like is inhibited even when it is used repeatedly over a great number of times in electrical inspection of, for example, integrated circuits formed on wafer. As a result, necessary conductivity is retained over a long period of time, and thus high durability and long service life are achieved.

Those composed of gold and another high-conductive metal are used as the coating layers of the conductive particles P, whereby conductive parts for connection having high conductivity are obtained, and moreover the surfaces of the conductive particles are inhibited from being deteriorated even when the anisotropically conductive connector is used repeatedly over a great number of times under a high-temperature environment. As a result, necessary conductivity is retained over a long period of time, and thus high durability and long service life are achieved.

Those that the proportion of the mass of the coating layer to the mass of the core particles is at least 150 by mass, and the thickness t of the coating layer formed of the high-conductive metal is at least 40 nm are used as the conductive particles P, whereby, in the case where the anisotropically conductive connector is used repeatedly under a high-temperature environment, the conductivity of such conductive particles P is not markedly lowered because the high-conductive metal exists in a high proportion on the surfaces of the conductive particles P even when the substance forming the magnetic core particles and a substance forming electrodes to be inspected migrate into the coating layer. As a result, necessary conductivity is retained over a long period of time, and thus high durability and long service life are achieved.

Since the part 25 to be supported is formed at the peripheral edge of the functional part 21 having the conductive parts 22 for connection in each of the elastic anisotropically conductive films 20, and this part 25 to be supported is fixed to the periphery about the anisotropically conductive film-arranging hole 11 in the frame plate 10, the anisotropically conductive connector is hard to be deformed and easy to handle, so that the positioning and the holding and fixing to a wafer, which is an object of inspection, can be easily conducted in an electrically connecting operation to the wafer.

Since the respective anisotropically conductive film-arranging holes 11 in the frame plate 10 are formed corresponding to electrode regions, in which electrodes to be inspected have been formed, of integrated circuits in a wafer, which is an object of inspection, and the elastic anisotropically conductive film 20 arranged in each of the anisotropically conductive film-arranging holes 11 may be small in area, the individual elastic anisotropically conductive films 20 are easy to be formed. In addition, since the elastic anisotropically conductive film 20 small in area is little in the absolute quantity of thermal expansion in a plane direction of the elastic anisotropically conductive film 20 even when it is subjected to thermal hysteresis, the thermal expansion of the elastic anisotropically conductive film 20 in the plane direction is surely restrained by the frame plate by using a material having a low coefficient of linear thermal expansion as that for forming the frame plate 10. Accordingly, a good electrically connected state can be stably retained even when the WLBI test or probe test is performed on a large-area wafer.

That exhibiting magnetism is used as the frame plate 10, whereby the curing treatment of the molding material layers 20A can be conducted in the formation of the elastic anisotropically conductive films 20 in a state that the conductive particles P have been existed in the portions to become the parts 25 to be supported in the molding material layers 20A by applying, for example, a magnetic field to said portions, so that the conductive particles P existing in the portions to become the parts 25 to be supported in the molding material layers 20A, i.e., the portions located above and below the peripheries about the anisotropically conductive film-arranging holes 11 in the frame plate 10 are not gathered to the portions to become the conductive parts 22 for connection. As a result, the conductive particles P are surely prevented from being contained in excess in the conductive parts 22 for connection located most outside among the conductive parts 22 for connection in the elastic anisotropically conductive film 20. Accordingly, there is no need to reduce the content of the conductive particles P in the molding material layers 20A, so that good conductivity is surely achieved as to all the conductive parts 22 for connection, and insulating property between adjoining conductive parts 22 for connection is surely attained.

Since the positioning holes 16 are formed in the frame plate 10, positioning to the wafer, which is the object of inspection, or the circuit board for inspection can be easily conducted.

Since the air circulating holes 15 are formed in the frame plate 10, air existing between the anisotropically conductive connector and the circuit board for inspection is discharged through the air circulating holes 15 in the frame plate 10 at the time the pressure within a chamber is reduced when that by the pressure reducing system is utilized as the means for pressing the probe member in a wafer inspection apparatus, which will be described subsequently, whereby the anisotropically conductive connector can be surely brought into close contact with the circuit board for inspection, so that the necessary electrical connection can be achieved with certainty.

[Wafer Inspection Apparatus]

Figure 12:
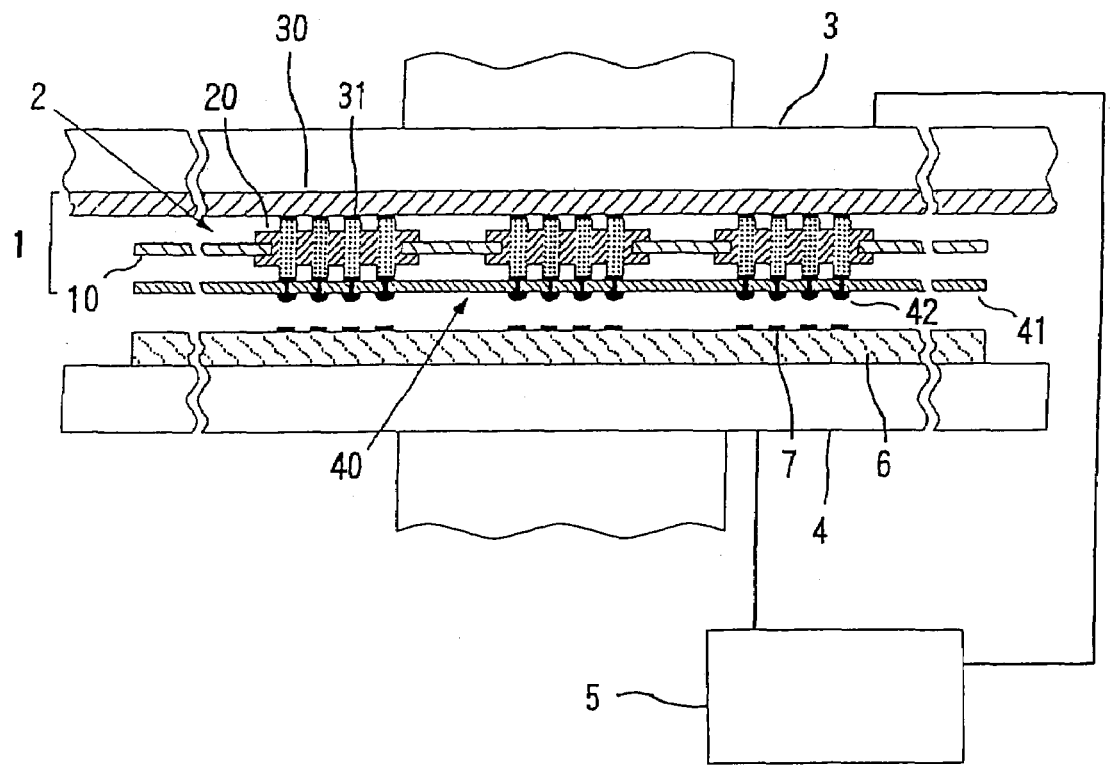
FIG. 12 is a cross-sectional view illustrating the construction of an exemplary wafer inspection apparatus using the anisotropically conductive connector according to the present invention.

FIG. 12 is a cross-sectional view schematically illustrating the construction of an exemplary wafer inspection apparatus making use of the anisotropically conductive connector according to the present invention. This wafer inspection apparatus serves to perform electrical inspection of each of a plurality of integrated circuits formed on a wafer in a state of the wafer.

Figure 13:
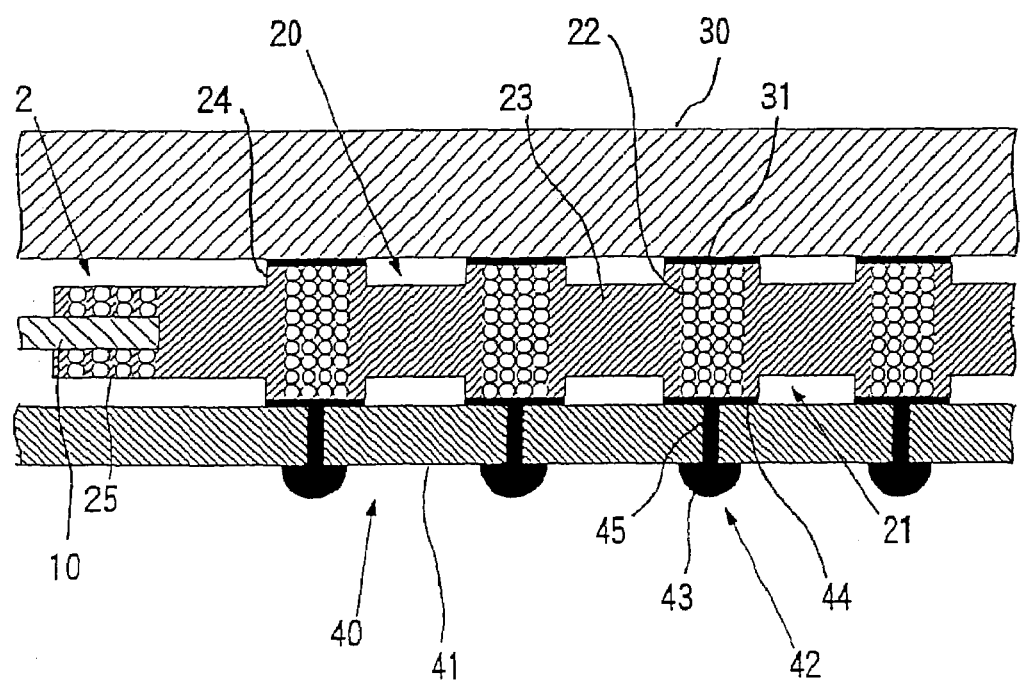
FIG. 13 is a cross-sectional view illustrating the construction of a principal part of an exemplary probe member according to the present invention.

The wafer inspection apparatus shown in FIG. 12 has a probe member 1 for conducting electrical connection of each of electrodes 7 to be inspected of a wafer 6, which is an object of inspection, to a tester. As also illustrated on an enlarged scale in FIG. 13, the probe member 1 has a circuit board 30 for inspection, on the front surface (lower surface in the figure) of which a plurality of inspection electrodes 31 have been formed in accordance with a pattern corresponding to a pattern of the electrodes 7 to be inspected of the wafer 6 that is the object of inspection. On the front surface of the circuit board 30 for inspection is provided the anisotropically conductive connector 2 of the construction illustrated in FIGS. 1 to 4 in such a manner that the conductive parts 22 for connection in the elastic anisotropically conductive films 20 thereof are opposed to and brought into contact with the inspection electrodes 31 of the circuit board 30 for inspection, respectively. On the front surface (lower surface in the figure) of the anisotropically conductive connector 2 is provided a sheet-like connector 40, in which a plurality of electrode structures 42 have been arranged in an insulating sheet 41 in accordance with the pattern corresponding to the pattern of the electrodes 7 to be inspected of the wafer 6, which is the object of inspection, in such a manner that the electrode structures 42 are opposed to and brought into contact with the conductive parts 22 for connection in the elastic anisotropically conductive films 20 of the anisotropically conductive connector 2, respectively.

On the back surface (upper surface in the figure) of the circuit board 30 for inspection in the probe member 1 is provided a pressurizing plate 3 for pressurizing the probe member 1 downward. A wafer mounting table 4, on which the wafer 6 that is the object of inspection is mounted, is provided below the probe member 1. A heater 5 is connected to each of the pressurizing plate 3 and the wafer mounting table 4.

As a base material for making up the circuit board 30 for inspection, may be used any of conventionally known various base materials. Specific examples thereof include composite resin materials such as glass fiber-reinforced epoxy resins, glass fiber-reinforced phenol resins, glass fiber-reinforced polyimide resins and glass fiber-reinforced bismaleimidotriazine resins, and ceramic materials such as glass, silicon dioxide and alumina.

When a wafer inspection apparatus for performing the WLBI test or probe test is constructed, a material having a coefficient of linear thermal expansion of at most $3 \times 10^{-5}$/K, more preferably $1 \times 10^{-7}$ to $1 \times 10^{-5}$/K, particularly preferably $1 \times 10^{-6}$ to $6 \times 10^{-6}$/K is preferably used.

Specific examples of such a base material include Pyrex (Registered trademark) glass, quartz glass, alumina, beryllia, silicon carbide, aluminum nitride and boron nitride.

The sheet-like connector 40 in the probe member 1 will be described specifically. This sheet-like connector 40 has a flexible insulating sheet 41, and in this insulating sheet 41, a plurality of electrode structures 42 extending in the thickness-wise direction of the insulating sheet 41 and composed of a metal are arranged in a state separated from each other in a plane direction of the insulating sheet 41 in accordance with the pattern corresponding to the pattern of the electrodes 7 to be inspected of the wafer 6 that is the object of inspection.

Each of the electrode structures 42 is formed by integrally connecting a projected front-surface electrode part 43 exposed to the front surface (lower surface in the figure) of the insulating sheet 41 and a plate-like back-surface electrode part 44 exposed to the back surface of the insulating sheet 41 to each other by a short circuit part 45 extending through in the thickness-wise direction of the insulating sheet 41.

No particular limitation is imposed on the insulating sheet 41 so far as it has insulating property and is flexible. For example, a resin sheet formed of a polyimide resin, liquid crystal polymer, polyester, fluororesin or the like, or a sheet obtained by impregnating a cloth woven by fibers with any of the above-described resins may be used.

No particular limitation is also imposed on the thickness of the insulating sheet 41 so far as such an insulating sheet 41 is flexible. However, it is preferably 10 to 50 μm, more preferably 10 to 25 μm.

As a material for forming the electrode structures 42, may be used nickel, copper, gold, silver, palladium, iron or the like. The electrode structures 42 may be any of those formed of a single metal as a whole, those formed of an alloy of at least two metals and those obtained by laminating at least two metals.

On the surfaces of the front-surface electrode part 43 and back-surface electrode part 44 in the electrode structure 42, a film of a chemically stable metal having high conductivity, such as gold, silver or palladium is preferably formed in that oxidation of the electrode parts is prevented, and electrode parts small in contact resistance are obtained.

The projected height of the front-surface electrode part 43 in the electrode structure 42 is preferably 15 to 50 μm, more preferably 15 to 30 μm in that stable electrical connection to the electrode 7 to be inspected of the wafer 6 can be achieved. The diameter of the front-surface electrode part 43 is preset according to the size and pitch of the electrodes to be inspected of the wafer 6 and is, for example, 30 to 80 μm, preferably 30 to 50 μm.

It is only necessary for the diameter of the back-surface electrode part 44 in the electrode structure 42 to be greater than the diameter of the short circuit part 45 and smaller than the arrangement pitch of the electrode structures 42, and the diameter is preferably great as much as possible, whereby stable electrical connection to the conductive part 22 for connection in the elastic anisotropically conductive film 20 of the anisotropically conductive connector 2 can also be achieved with certainty. The thickness of the back-surface electrode part 44 is preferably 20 to 50 μm, more preferably 30 to 40 μm in that sufficiently high strength and excellent repetitive durability are achieved.

The diameter of the short circuit part 45 in the electrode structure 42 is preferably 30 to 80 μm, more preferably 30 to 50 μm in that sufficiently high strength is achieved.

The sheet-like connector 40 can be produced, for example, in the following manner.

More specifically, a laminate material obtained by laminating a metal layer on an insulating sheet 41 is provided, and a plurality of through-holes extending through in the thickness-wise direction of the insulating sheet 41 are formed in the insulating sheet 41 of the laminate material in accordance with a pattern corresponding to a pattern of electrode structures 42 to be formed by laser machining, dry etch machining or the like. This laminate material is then subjected to photolithography and a plating treatment, whereby short circuit parts 45 integrally connected to the metal layer are formed in the through-holes in the insulating sheet 41, and at the same time, projected front-surface electrode parts 43 integrally connected to the respective short circuit parts 45 are formed on a front surface of the insulating sheet 41. Thereafter, the metal layer of the laminate material is subjected to a photo-etching treatment to remove a part thereof, thereby forming back-surface electrode parts 44 to form the electrode structures 42, thus obtaining the sheet-like connector 40.

In such an electrical inspection apparatus, a wafer 6, which is an object of inspection, is mounted on the wafer mounting table 4, and the probe member 1 is then pressurized downward by the pressurizing plate 3, whereby the respective front-surface electrode parts 43 in the electrode structures 42 of the sheet-like connector 40 thereof are brought into contact with their corresponding electrodes 7 to be inspected of the wafer 6, and moreover the respective electrodes 7 to be inspected of the wafer 6 are pressurized by the front-surface electrodes parts 43. In this state, the conductive parts 22 for connection in the elastic anisotropically conductive films 20 of the anisotropically conductive connector 2 are respectively held and pressurized by the inspection electrodes 31 of the circuit board 30 for inspection and the front-surface electrode parts 43 of the electrode structures 42 of the sheet-like connector 40 and compressed in the thickness-wise direction of the elastic anisotropically conductive films 20, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a predetermined temperature through the wafer mounting table 4 and the pressurizing plate 3 by the heater 5. In this state, necessary electrical inspection is performed on each of a plurality of integrated circuits in the wafer 6.

According to such a wafer inspection apparatus, it is equipped with the probe member 1 having the anisotropically conductive connector 2 high in durability and long in service life, so that the frequency of replacing the anisotropically conductive connector 2 by a new one can be reduced, whereby the inspection of wafers can be conducted at high efficiency, and the inspection cost can be reduced.

In addition, positioning, and holding and fixing to the wafer can be conducted with ease even when the pitch of the electrodes 7 to be inspected is small, and moreover the necessary electrical inspection can be stably performed over a long period of time even when the apparatus is used repeatedly under a high-temperature environment.

Further, since each of the elastic anisotropically conductive films 20 in the anisotropically conductive connector 2 is small in its own area, and the absolute quantity of thermal expansion in a plane direction of the elastic anisotropically conductive film 20 is little even when it is subjected to thermal hysteresis, the thermal expansion of the elastic anisotropically conductive film 20 in the plane direction is surely restrained by the frame plate by using a material having a low coefficient of linear thermal expansion as that for forming the frame plate 10. Accordingly, a good electrically connected state can be stably retained even when the WLBI test is performed on a large-area wafer.

Figure 14:
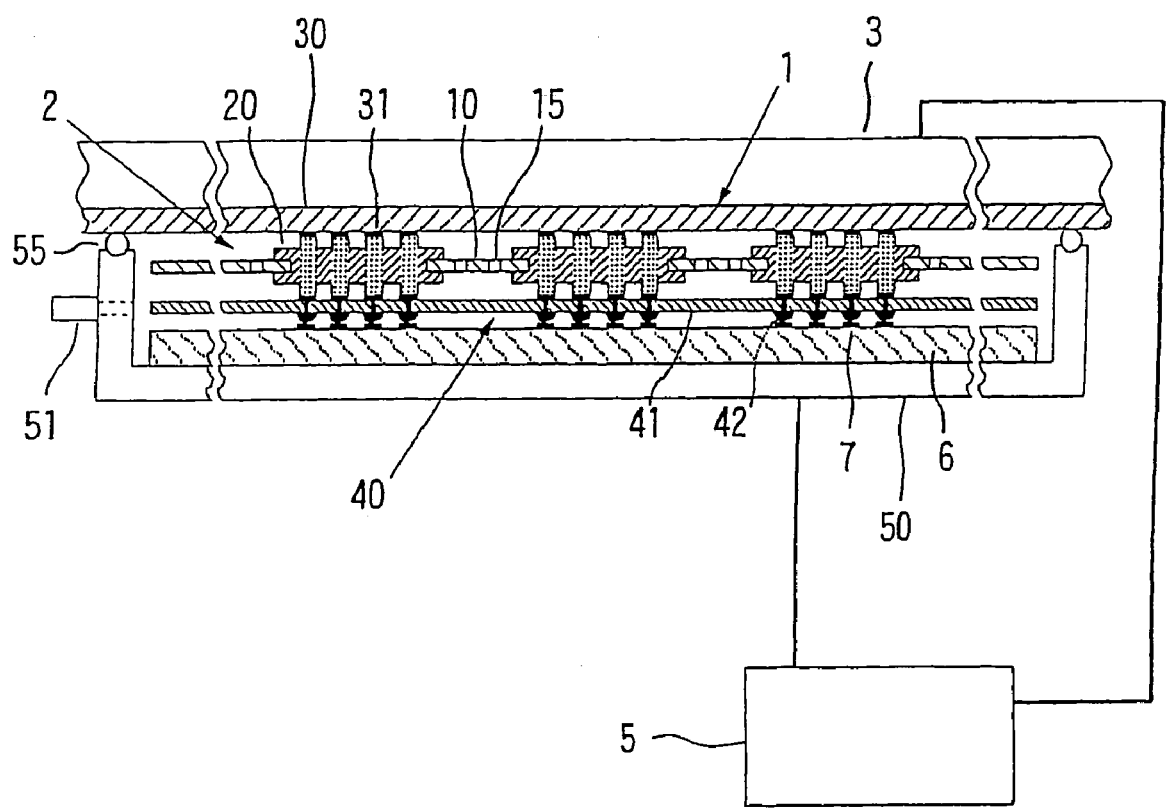
FIG. 14 is a cross-sectional view illustrating the construction of another exemplary wafer inspection apparatus using the anisotropically conductive connector according to the present invention.

FIG. 14 is a cross-sectional view schematically illustrating the construction of another exemplary wafer inspection apparatus making use of the anisotropically conductive connector according to the present invention.

This wafer inspection apparatus has a box-type chamber 50 opened at the top thereof, in which a wafer 6 that is an object of inspection is housed. An evacuation pipe 51 for evacuating air within the chamber 50 is provided in a sidewall of this chamber 50, and an evacuator (not illustrated) such as, for example, a vacuum pump, is connected to the evacuation pipe 51.

A probe member 1 of the same construction as the probe member 1 in the wafer inspection apparatus shown in FIG. 12 is arranged on the chamber 50 so as to air-tightly close the opening of the chamber 50. More specifically, an elastic O-ring 55 is arranged in close contact on an upper end surface of the sidewall in the chamber 50, and the probe member 1 is arranged in a state that the anisotropically conductive connector 2 and sheet-like connector 40 thereof have been housed in the chamber 50, and the periphery of the circuit board 30 for inspection thereof has been brought into close contact with the O-ring 55. Further, the circuit board 30 for inspection is held in a state pressurized downward by a pressurizing plate 3 provided on the back surface (upper surface in the figure) thereof.

A heater 5 is connected to the chamber 50 and the pressurizing plate 3.

In such a wafer inspection apparatus, the evacuator connected to the evacuation pipe 51 of the chamber 50 is driven, whereby the pressure within the chamber 50 is reduced to, for example, 1,000 Pa or lower. As a result, the probe member 1 is pressurized downward by the atmospheric pressure, whereby the O-ring 55 is elastically deformed, and so the probe member 1 is moved downward. As a result, electrodes 7 to be inspected of the wafer 6 are respectively pressurized by their corresponding front-surface electrode parts 43 in electrode structures 42 of the sheet-like connector 40. In this state, the conductive parts 22 for connection in the elastic anisotropically conductive films 20 of the anisotropically conductive connector 2 are respectively held and pressurized by the inspection electrodes 31 of the circuit board 30 for inspection and the front-surface electrode parts 43 in the electrode structures 42 of the sheet-like connector 40 and compressed in the thickness-wise direction, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a predetermined temperature through the chamber 50 and the pressurizing plate 3 by the heater 5. In this state, necessary electrical inspection is performed on each of a plurality of integrated circuits in the wafer 6.

According to such a wafer inspection apparatus, the same effects as those in the wafer inspection apparatus shown in FIG. 12 are brought about. In addition, the whole inspection apparatus can be miniaturized because any large-sized pressurizing mechanism is not required, and moreover the whole wafer 6, which is the object of inspection, can be pressed by even force even when the wafer 6 has a large area of, for example, 8 inches or greater in diameter. In addition, since the air circulating holes 15 are formed in the frame plate 10 in the anisotropically conductive connector 2, air existing between the anisotropically conductive connector 2 and the circuit board 30 for inspection is discharged through the air circulating holes 15 of the frame plate 10 in the anisotropically conductive connector 2 when the pressure within the chamber 50 is reduced, whereby the anisotropically conductive connector 2 can be surely brought into close contact with the circuit board 30 for inspection, so that the necessary electrical connection can be achieved with certainty.

Other Embodiments

The present invention is not limited to the above-described embodiments, and the following various changes or modifications may be added thereto.

(1) In the anisotropically conductive connector, conductive parts for non-connection that are not electrically connected to any electrode to be inspected in a wafer may be formed in the elastic anisotropically conductive films 20 in addition to the conductive parts 22 for connection. An anisotropically conductive connector having anisotropically conductive films, in which the conductive parts for non-connection have been formed, will hereinafter be described.

Figure 15:
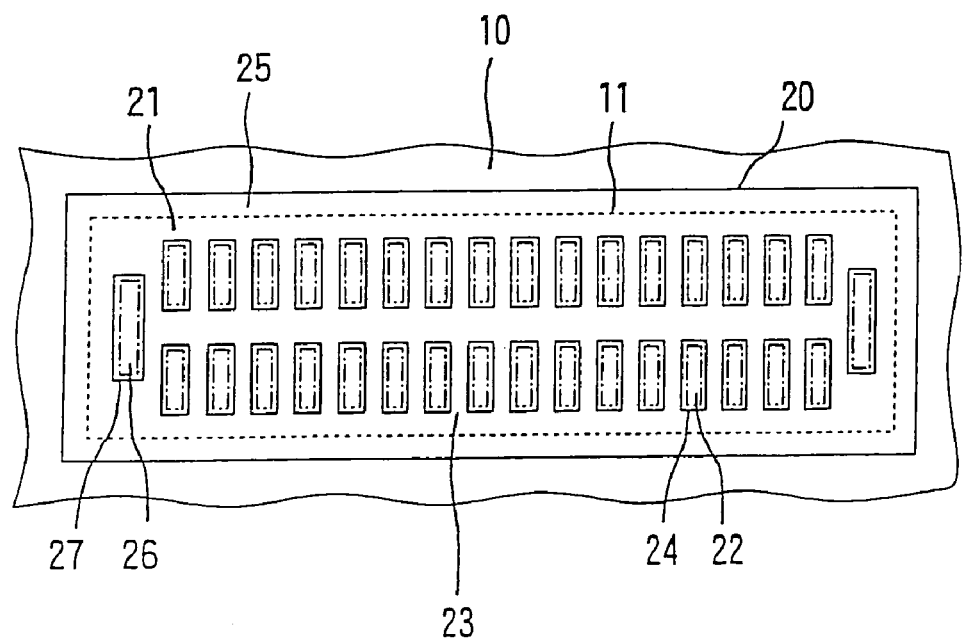
FIG. 15 is a plan view illustrating, on an enlarged scale, an elastic anisotropically conductive film in an anisotropically conductive connector according to another embodiment of the present invention.

FIG. 15 is a plan view illustrating, on an enlarged scale, an elastic anisotropically conductive film in an anisotropically conductive connector according to another embodiment of the present invention. In the elastic anisotropically conductive film 20 of this anisotropically conductive connector, a plurality of conductive parts 22 for connection that are electrically connected to electrodes to be inspected in a wafer, which is an object of inspection, and extend in the thickness-wise direction (direction perpendicular to the paper in FIG. 15) are arranged so as to align in 2 lines in accordance with a pattern corresponding to a pattern of the electrodes to be inspected. Each of these conductive parts 22 for connection contains conductive particles exhibiting magnetism at a high density in a state oriented so as to align in the thickness-wise direction and are mutually insulated by an insulating part 23, in which the conductive particles are not contained at all or scarcely contained.

Conductive parts 26 for non-connection that are not electrically connected to any electrode to be inspected in the wafer, which is the object of inspection, and extend in the thickness-wise direction are formed between the conductive parts 22 for connection located most outside in a direction that the conductive parts 22 for connection are arranged, and the frame plate 10. The conductive parts 26 for non-connection contain the conductive particles exhibiting magnetism at a high density in a state oriented so as to align in the thickness-wise direction and are mutually insulated from the conductive parts 22 for connection by the insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and portions, at which the conductive parts 26 for non-connection and peripheries thereof are located, are formed at those portions on both surfaces of the functional part 21 in the elastic anisotropically conductive film 20.

At the peripheral edge of the functional part 21, a part 25 to be supported that is fixed to and supported by the peripheral edge about the anisotropically conductive film-arranging hole 11 in the frame plate 10 is formed integrally and continuously with the functional part 21, and the conductive particles are contained in this part 25 to be supported.

Other constitutions are basically the same as those in the anisotropically conductive connector shown in FIGS. 1 to 4.

Figure 16:
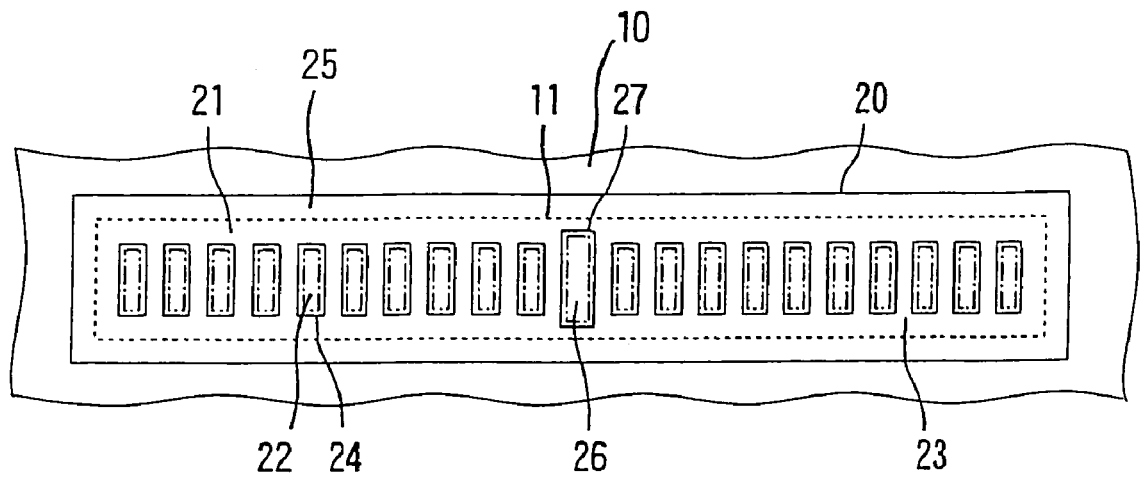
FIG. 16 is a plan view illustrating, on an enlarged scale, an elastic anisotropically conductive film in an anisotropically conductive connector according to a further embodiment of the present invention.

FIG. 16 is a plan view illustrating, on an enlarged scale, an elastic anisotropically conductive film in an anisotropically conductive connector according to a further embodiment of the present invention. In the elastic anisotropically conductive film 20 of this anisotropically conductive connector, a plurality of conductive parts 22 for connection that are electrically connected to electrodes to be inspected in a wafer, which is an object of inspection, and extend in the thickness-wise direction (direction perpendicular to the paper in FIG. 16) are arranged in a functional part 21 thereof so as to align in accordance with a pattern corresponding to a pattern of the electrodes to be inspected. Each of these conductive parts 22 for connection contains conductive particles exhibiting magnetism at a high density in a state oriented so as to align in the thickness-wise direction and are mutually insulated by an insulating part 23, in which the conductive particles are not contained at all or scarcely contained.

Among these conductive parts 22 for connection, 2 conductive parts 22 for connection, which are located at the center and adjoin each other, are arranged at a clearance greater than a clearance between other adjacent conductive parts 22 for connection. A conductive part 26 for non-connection that is not electrically connected to any electrode to be inspected in the wafer, which is the object for inspection, and extends in the thickness-wise direction is formed between the 2 conductive parts 22 for connection, which are located at the center and adjoin each other. This conductive part 26 for non-connection contains the conductive particles exhibiting magnetism at a high density in a state oriented so as to align in the thickness-wise direction and is mutually insulated from the conductive parts 22 for connection by an insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and a portion, at which the conductive part 26 for non-connection and a periphery thereof are located, are formed at those portions on both surfaces of the functional part 21 in the elastic anisotropically conductive film 20.

At the peripheral edge of the functional part 21, a part 25 to be supported that is fixed to and supported by the peripheral edge about the anisotropically conductive film-arranging hole 11 in the frame plate 10 is formed integrally and continuously with the functional part 21, and the conductive particles are contained in this part 25 to be supported.

Other specific constitutions are basically the same as those in the anisotropically conductive connector shown in FIGS. 1 to 4.

The anisotropically conductive connector shown in FIG. 15 and the anisotropically conductive connector shown in FIG. 16 can be produced in a similar manner to the process for producing the anisotropically conductive connector shown in FIGS. 1 to 4 by using a mold composed of a top force and a bottom force, on which ferromagnetic substance layers have been respectively formed in accordance with a pattern corresponding to an arrangement pattern of the conductive parts 22 for connection and conductive parts 26 for non-connection in the elastic anisotropically conductive films 20 to be formed, and non-magnetic substance layer has been formed at other portion than the ferromagnetic substance layers, in place of the mold shown in FIG. 7.

More specifically, according to such a mold, a pair of, for example, electromagnets are arranged on an upper surface of a base plate in the top force and a lower surface of a base plate in the bottom force, and the electromagnets are operated, whereby in a molding material layers formed between the top force and the bottom force, conductive particles dispersed in portions to become the functional parts 21 in the molding material layers are gathered to portions to become the conductive parts 22 for connection and portions to become the conductive parts 26 for non-connection, and oriented so as to align in the thickness-wise direction. On the other hand, the conductive particles located above and below the frame plate 10 in the molding material layers remain retained above and below the frame plate 10.

In this state, the molding material layers are subjected to a curing treatment, whereby the elastic anisotropically conductive films 20 each composed of the functional part 21, in which a plurality of the conductive parts 22 for connection and conductive part(s) 26 for non-connection containing the conductive particles in the elastic polymeric substance in a state oriented so as to align in the thickness-wise direction are arranged in a state mutually insulated by the insulating part 23 composed of the elastic polymeric substance, in which the conductive particles are not present at all or scarcely present, and the part 25 to be supported, which is formed continuously and integrally with a peripheral edge of the functional part 21 and in which the conductive particles are contained in the elastic polymeric substance, are formed in a state that the part 25 to be supported has been fixed to the periphery about each anisotropically conductive film-arranging hole 11 of the frame plate 10, thus producing the anisotropically conductive connector.

The conductive parts 26 for non-connection in the anisotropically conductive connector shown in FIG. 15 are each obtained by applying a magnetic field to portions to become the conductive parts 26 for non-connection in the molding material layer upon the formation of the elastic anisotropically conductive film 20 to gather the conductive particles existing between the portions located most outside in the molding material layer, which will become the conductive parts 22 for connection, and the frame plate 10 to the portions to become the conductive parts 26 for non-connection, and subjecting the molding material layer to a curing treatment in this state. Thus, the conductive particles are prevented from being gathered in excess to the portions to become the conductive parts 22 for connection, which are located most outside in the molding material layer. Accordingly, even when the elastic anisotropically conductive films 20 to be formed each have comparatively many conductive parts 22 for connection, it is surely prevented to contain an excessive amount of the conductive particles in the conductive parts 22 for connection located most outside in the elastic anisotropically conductive film 20.

The conductive parts 26 for non-connection in the anisotropically conductive connector shown in FIG. 16 are each obtained by applying a magnetic field to the portion to become the conductive part 26 for non-connection in the molding material layer upon the formation of the elastic anisotropically conductive film 20 to gather the conductive particles existing between the 2 adjoining portions arranged at a greater clearance in the molding material layer, which will become the conductive parts 22 for connection, to the portion to become the conductive part 26 for non-connection, and subjecting the molding material layer to a curing treatment in this state. Thus, the conductive particles are prevented from being gathered in excess to the 2 adjoining portions arranged at a greater clearance in the molding material layer, which will become the conductive parts 22 for connection upon the formation of the elastic anisotropically conductive film 20. Accordingly, even when the elastic anisotropically conductive films 20 to be formed each have at least 2 conductive parts 22 for connection arranged at a greater clearance, it is surely prevented to contain an excessive amount of the conductive particles in these conductive parts 22 for connection.

(2) In the anisotropically conductive connectors, the projected parts 24 in the elastic anisotropically conductive films 20 are not essential, and one or both surfaces may be flat, or a recessed portion may be formed.

(3) A metal layer or DLC (diamond like carbon) layer may be formed on the surfaces of the conductive parts 22 for connection in the elastic anisotropically conductive films 20.

(4) The uses of the anisotropically conductive connectors according to the present invention are not limited to the inspection of wafers, but are useful as connectors used in inspection of electronic parts such as semiconductor chips and packaged integrated circuit devices, and connectors used in mounting of electronic parts.

(5) When a non-magnetic substance is used as a base material of the frame plate 10 in the production of the anisotropically conductive connector, as a means for applying the magnetic field to portions to become the parts 25 to be supported in the molding material layers 20A, a means of plating peripheries about the anisotropically conductive film-arranging holes 11 in the frame plate 10 with a magnetic substance or coating the peripheries with a magnetic paint to apply a magnetic field thereto, or a means of forming ferromagnetic substance layers on the mold 60 corresponding to the parts 25 to be supported of the elastic anisotropically conductive films 20 to apply a magnetic field thereto may be utilized.

(6) The use of the spacer is not essential in the formation of the molding material layers, and spaces for forming the elastic anisotropically conductive films may be secured between the top force and bottom force, and the frame plate by any other means.

Figure 17:
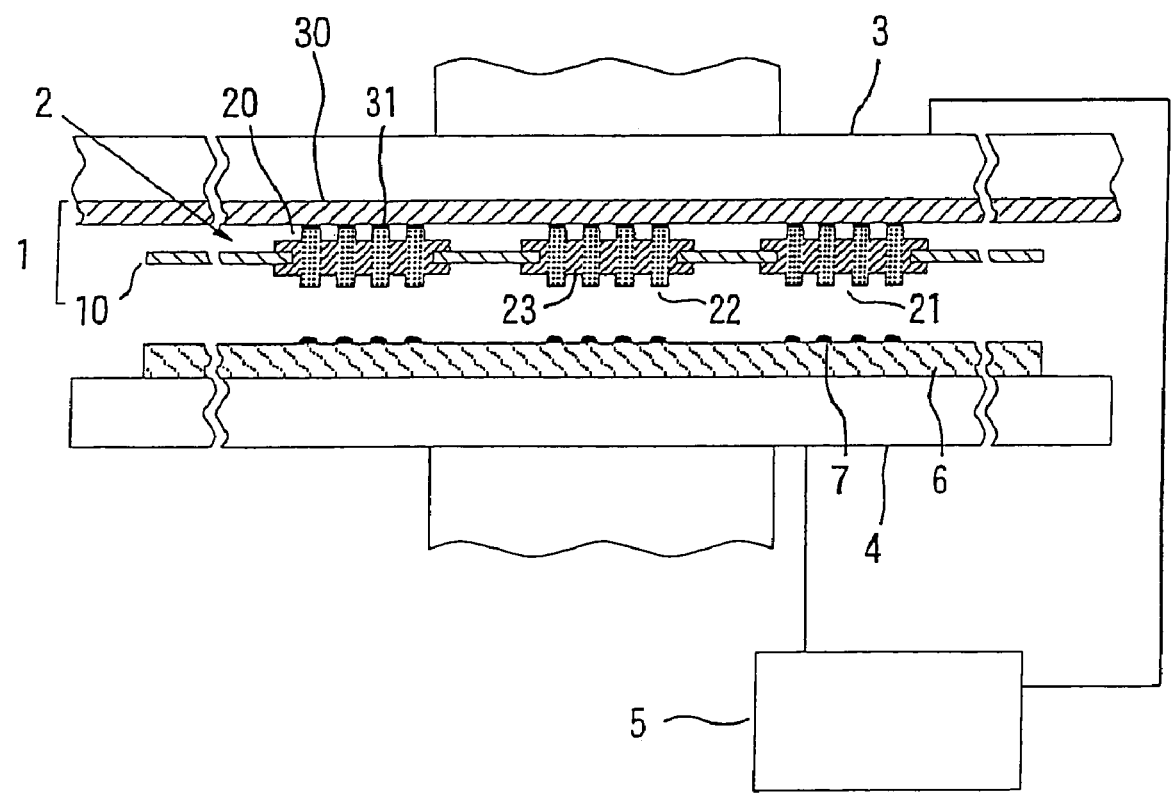
FIG. 17 is a cross-sectional view illustrating the construction of a further exemplary wafer inspection apparatus using the anisotropically conductive connector according to the present invention.

(7) In the probe member 1, the sheet-like connector 40 is not essential. When electrodes 7 to be inspected of a wafer 6, which is an object of inspection, are, for example, semi-spherical projected electrodes composed of solder, the probe member 1 may be so constructed that the elastic anisotropically conductive films 20 in the anisotropically conductive connector 2 are brought into contact with the wafer 6 to achieve electrical connection as illustrated in FIG. 17.

(8) In the inspection method for wafers making use of the anisotropically conductive connector according to the present invention or the probe member according to the present invention, it is not essential to collectively conduct the inspection as to all integrated circuits formed on a wafer.

In the burn-in test, inspection time required of each of integrated circuits is as long as several hours, and so high time efficiency can be achieved when the inspection is conducted collectively on all integrated circuits formed on a wafer. In the probe test on the other hand, inspection time required of each of integrated circuits is as short as several minutes, and so a wafer may be divided into 2 or more areas to conduct the probe test collectively on integrated circuits formed in each of the divided areas.

According to the method that electrical inspection is conducted every divided area as to integrated circuits formed on a wafer as described above, when the electrical inspection is conducted as to integrated circuits formed at a high degree of integration on a wafer having a diameter of 8 inches or 12 inches, the numbers of inspection electrodes and wirings of the circuit board for inspection used can be reduced compared with the method that the inspection is conducted collectively on all the integrated circuits, whereby the production cost of the inspection apparatus can be reduced.

Since the anisotropically conductive connector according to the present invention or the probe member according to the present invention is high in durability in repeated use, the frequency of occurrence of trouble with the anisotropically conductive connector and replacement of the same by a new one becomes low when it is used in the method that the electrical inspection is conducted, as to the integrated circuits formed on a wafer, in every divided area, so that inspection cost can be reduced.

The present invention will hereinafter be described specifically by the following examples. However, the present invention is not limited to these examples.

In the following Examples, physical properties of addition type liquid silicone rubber and physical properties of coating layers in conductive particles were determined in the following manner.

(1) Viscosity of Addition Type Liquid Silicone Rubber:

A viscosity at 23±2° C. was measured by a Brookfield viscometer.

(2) Compression Set of Cured Silicone Rubber:

Solution A and Solution B in addition type liquid silicone rubber of a two-pack type were stirred and mixed in proportions that their amounts become equal. After this mixture was then poured into a mold and subjected to a defoaming treatment by pressure reduction, a curing treatment was conducted under conditions of 120° C. for 30 minutes, thereby producing a columnar body having a thickness of 12.7 mm and a diameter of 29 mm and composed of cured silicone rubber. The columnar body was post-cured under conditions of 200° C. for 4 hours. The columnar body obtained in such a manner was used as a specimen to measure its compression set at 150±2° C. in accordance with JIS K 6249.

(3) Tear Strength of Cured Silicone Rubber:

A curing treatment and post-curing of addition type liquid silicone rubber were conducted under the same conditions as in the item (2), thereby producing a sheet having a thickness of 2.5 mm. A crescent type specimen was prepared by punching from this sheet to measure its tear strength at 23±2° C. in accordance with JIS K 6249.

(4) Durometer A Hardness:

Five sheets produced in the same manner as in the item (3) were stacked on one another, and the resultant laminate was used as a specimen to measure its durometer A hardness at 23±2° C. in accordance with JIS K 6249.

(5) Vickers Hardness of Coating Layer of Conductive Particles:

A Vickers hardness of a coating layer of conductive particles was determined by forming a coating layer on a flat nickel plate having a thickness of 1 mm by the same process (plating or sputtering) as in formation of the coating layer of the conductive particles to measure a Vickers hardness as to this coating layer in accordance with JIS Z 2244.

Incidentally, the thickness of the coating layer formed is preset in accordance with JIS Z 2244. When the coating layer is formed by sputtering, however, the thickness was preset within a range of 0.5 to 1 μm because it was difficult to form a coating layer having a great thickness.

PREPARATION EXAMPLE 1 OF MAGNETIC CORE PARTICLES

Commercially available nickel particles (product of Westaim Co., "FC1000") were used to prepare Magnetic Core Particles [A] in the following manner.

An air classifier (manufactured by Nittetsu Mining Co., Ltd., "Elbow-Jet EJ-L-3 Model") making use of Coanda effect was used to subject 2 kg of the nickel particles to a classification treatment under conditions of a specific gravity of 8.9, an ejector pressure of 0.2 MPa, cut points of F 6 μm, M 12 μm and a feed rate of the nickel particles of 1.47 kg/hr to collect particles, thereby preparing 1.4 kg of magnetic core particles. The magnetic core particles will hereinafter be referred to as "Magnetic Core Particles [A]".

Magnetic Core Particles [A] thus obtained had a number average particle diameter of 8.5 μm, a coefficient of variation of the particle diameter of 31%, a BET specific surface area of $0.45 \times 10^3$ m$^2$/kg and a saturation magnetization of 0.6 Wb/m$^2$.

PREPARATION EXAMPLE 2 OF MAGNETIC CORE PARTICLES

Commercially available nickel particles (product of Westaim Co., "SF300") were used as Magnetic Core Particles [B] as they are.

Magnetic Core Particles [B] had a number average particle diameter of 26.9 μm, a coefficient of variation of the particle diameter of 33%, a BET specific surface area of $0.19 \times 10^3$ m$^2$/kg and a saturation magnetization of 0.6 Wb/m$^2$.

PREPARATION EXAMPLE 1 OF CONDUCTIVE PARTICLES (1) Surface Oxide Film-Removing Treatment for Magnetic Core Particles:

Into a powder treating vessel, were poured 100 g of Magnetic Core Particles [A], and 2 L of 3.2 N hydrochloric acid was added. The resultant mixture was stirred to obtain a slurry containing Magnetic Core Particles [A]. This slurry was stirred at ordinary temperature for 30 minutes, thereby conducting a surface oxide film-removing treatment for Magnetic Core Particles [A]. Thereafter, the slurry thus treated was left at rest for 1 minute to precipitate Magnetic Core Particles [A], and a supernatant was removed.

To Magnetic Core Particles [A] subjected to the surface oxide film-removing treatment, were added 2 L of purified water, and the mixture was stirred at ordinary temperature for 2 minutes. The mixture was then left at rest for 1 minute to precipitate Magnetic Core Particles [A], and a supernatant was removed. This process was further conducted repeatedly twice, thereby conducting a surface-washing treatment for Magnetic Core Particles [A].

(2) Anti-oxidizing Treatment for Magnetic Core Particles:

A 0.5% by mass aqueous solution of water-soluble fullerene (Mitsubishi Corporation, "PEG-Fullerene") was added to Magnetic Core Particles [A] subjected to the surface oxide film-removing treatment and surface-washing treatment, and the resulting mixture was stirred, thereby obtaining a slurry containing Magnetic Core Particles [A]. This slurry was stirred at ordinary temperature for 30 minutes, thereby conducting an anti-oxidizing treatment for the magnetic core particles. Thereafter, the slurry thus treated was left at rest for 1 minute to precipitate Magnetic Core Particles [A], and a supernatant was removed.

(3) Formation of Intermediate Coating Film:

Magnetic Core Particles [A] subjected to the anti-oxidizing treatment were poured into a treating vessel of a powder plating apparatus, and a gold plating solution (product of Tanaka Kikinzoku Kogyo K.K., "LECTROLESS") containing gold in a proportion of 20 g/L was added. The temperature within the treating vessel was raised to 90° C., and the contents were stirred, thereby preparing a slurry. While stirring the slurry in this state, Magnetic Core Particles [A] were subjected to electroless plating with gold. Thereafter, the slurry was left at rest while allowing it to cool, to precipitate particles, and a supernatant was removed, thereby preparing intermediate particles with an intermediate coating layer composed of gold formed on the surfaces of the magnetic core particles. After 2 L of purified water was then added to the treating vessel, and the contents were stirred at ordinary temperature for 2 minutes, the contents were left at rest for 1 minute to precipitate particles, and a supernatant was removed. This process was further conducted repeatedly twice, thereby conducting a surface-washing treatment for the intermediate particles.

(4) Formation of Surface Coating Layer:

A gold-cobalt alloy plating solution (product of JAPAN PURE CHEMICAL CO., LTD., "Ororabright HS-15") containing gold and cobalt in proportions of 15 g/L and 2 g/L, respectively, was poured into a treating vessel of a powder electroplating apparatus, in which mesh-like electrodes had been arranged. While stirring the gold-cobalt alloy plating solution, the intermediate particles were added into the gold-cobalt alloy plating solution to subject the intermediate particles to electroplating with a gold-cobalt alloy, thereby preparing conductive particles with a surface coating layer composed of the gold-cobalt alloy (cobalt content: 1%) formed on the surfaces of the magnetic core particles through the intermediate coating layer composed of gold.

After 2 L of purified water was then added to the treating vessel, and the contents were stirred at ordinary temperature for 2 minutes, the contents were left at rest for 1 minute to precipitate particles, and a supernatant was removed. After 2 L of purified water was then added to the treating vessel, and the contents were heated to 90° C., stirred and left at rest, a supernatant was removed. After this process was further repeated, a slurry containing conductive particles was taken out of the treating vessel and the slurry was filtered through filter paper, thereby collecting the conductive particles. The conductive particles thus obtained were subjected to a drying treatment by a dryer preset to 90° C.

(5) Classification Treatment of Conductive Particles:

The conductive particles were poured into a ball milling machine, into which a plurality of ceramic rods had been put, to conduct a grinding treatment for 2 hours. Thereafter, the conductive particles were taken out of the ball milling machine and subjected to a classification treatment by means of a sonic sifter (manufactured by Tsutsui Rikagaku Kiki K.K., "SW-20AT Model"). Specifically, 3 sieves respectively having opening diameters of 20 μm, 16 μm and 10 Em were superimposed on one another in this order from the top. Each of the sieves was charged with 7 g of ceramic balls, and the conductive particles subjected to the grinding treatment were placed on the uppermost sieve (opening diameter: 20 μm) to subject them to a classification treatment under conditions of 125 Hz for 15 minutes, thereby collecting conductive particles captured on the lowest sieve (opening diameter: 10 μm). This process was conducted twice, thereby conducting a classification treatment for the conductive particles. The conductive particles subjected to this classification treatment will hereinafter be referred to as "Conductive Particles [A1]".

Conductive Particles [A1] were such that the number average particle diameter was 8.8 μm, the BET specific surface area was $0.38 \times 10^3$ m$^2$/kg, the thickness of the intermediate coating layer was 42 nm, the thickness of the surface coating layer was 11 nm (total thickness of the coating layers: 53 nm), the proportion of the intermediate coating layer to Magnetic Core Particles [A] was 27% by mass, the proportion of the surface coating layer to Magnetic Core Particles [A] was 9% by mass (total proportion of the coating layers: 36% by mass), and the electric resistance value R was 0.05 Ω. Further, the Vickers hardness (Hv) of the intermediate coating layer was 20, and the Vickers hardness (HV) of the surface coating layer was 200.

PREPARATION EXAMPLE 2 OF CONDUCTIVE PARTICLES

Magnetic Core Particles [A] were subjected to a surface oxide film-removing treatment and a surface-washing treatment in the same manner as in Preparation Example 1 of conductive particles. Thereafter, a drying treatment of the particles was conducted by means of a vacuum drier under conditions of 150° C., $1 \times 10^{-3}$ Pa and 10 hours. Magnetic Core Particles [A] thus treated were then poured into a treating vessel of a powder sputtering apparatus (manufactured by NISSHIN STEEL CO., LTD.), and a target composed of gold was set. Thereafter, air within the treating vessel was evacuated to an atmospheric pressure of $1 \times 10^{-3}$ Pa while stirring Magnetic Core Particles [A], and argon gas was introduced into the treating vessel so as to give an atmospheric pressure of $1 \times 10^{-1}$ Pa. In this state, Magnetic Core Particle [A] were subjected to a sputtering treatment, thereby preparing intermediate particles with a coating layer composed of gold formed.

After the intermediate particles were cooled, they were taken out of the treating vessel. After the particles were then poured into ethanol, stirred and left at rest for 2 minutes, a supernatant was removed. This process was further conducted repeatedly twice, thereby conducting a washing treatment of the intermediate particles. A drying treatment of the intermediate particles was then conducted in an oven heated to 80° C.

The intermediate particles thus obtained were poured into a treating vessel of a powder sputtering apparatus (manufactured by NISSHIN STEEL CO., LTD.), and a target composed of rhodium was set. Thereafter, air within the treating vessel was evacuated to an atmospheric pressure of $1 \times 10^{-3}$ Pa while stirring the intermediate particles, and argon gas was introduced into the treating vessel so as to give an atmospheric pressure of $1 \times 10^{-1}$ Pa. In this state, the intermediate particles were subjected to a sputtering treatment to form a surface coating layer composed of rhodium, thereby preparing conductive particles.

After the conductive particles were then cooled, they were taken out of the treating vessel. After the particles were then poured into ethanol, stirred and left at rest for 2 minutes, a supernatant was removed. This process was further conducted repeatedly twice, thereby conducting a washing treatment for the conductive particles. A drying treatment of the conductive particles was then conducted in an oven heated to 80° C.

The conductive particles were subjected to a classification treatment in the same manner as in Preparation Example 1 of conductive particles. The conductive particles will hereinafter be referred to as "Conductive Particles [A2]".

Conductive Particles [A2] thus obtained were such that the number average particle diameter was 8.9 μm, the BET specific surface area of $0.37 \times 10^3$ m$^2$/kg, the thickness of the intermediate coating layer was 40 nm, the thickness of the surface coating layer was 11 nm (total thickness of the coating layers: 51 μm), the proportion of the intermediate coating layer to Magnetic Core Particles [A] was 26% by mass, the proportion of the surface coating layer to Magnetic Core Particles [A] was 6% by mass (total proportion of the coating layers: 32% by mass), and the electric resistance value R was 0.07 Ω. Further, the Vickers hardness (Hv) of the intermediate coating layer was 21, and the Vickers hardness (Hv) of the surface coating layer was 800.

PREPARATION EXAMPLE 3 OF CONDUCTIVE PARTICLES

Conductive particles were obtained in the same manner as in Preparation Example 2 of conductive particles except that a target composed of silver was used in place of the target composed of gold in Preparation Example 2 of conductive particles. The conductive particles will hereinafter be referred to as "Conductive Particles [A3]".

Conductive Particles [A3] thus obtained were such that the number average particle diameter was 9.1 μm, the BET specific surface area of $0.35 \times 10^3$ m$^2$/kg, the thickness of the intermediate coating layer was 37 nm, the thickness of the surface coating layer was 20 nm (total thickness of the coating layers: 57 nm), the proportion of the intermediate coating layer to Magnetic Core Particles [A] was 15% by mass, the proportion of the surface coating layer to Magnetic Core Particles [A] was 10% by mass (total proportion of the coating layers: 25% by mass), and the electric resistance value R was 0.08 Ω. Further, the Vickers hardness (Hv) of the intermediate coating layer was 24, and the Vickers hardness (Hv) of the surface coating layer was 800.

PREPARATION EXAMPLE 4 OF CONDUCTIVE PARTICLES

Conductive particles were obtained in the same manner as in Preparation Example 2 of conductive particles except that a target composed of an alloy (weight ratio: gold/palladium=9/1) of gold and palladium was used in place of the target composed of gold, and an operation of the sputtering treatment and the washing treatment was conducted only once in Preparation Example 2 of conductive particles. The conductive particles will hereinafter be referred to as "Conductive Particles [A4]".

Conductive Particles [A4] thus obtained were such that the number average particle diameter was 8.8 μm, the BET specific surface area of $0.38 \times 10^3$ m$^2$/kg, the thickness of the surface coating layer was 40 nm (total thickness of the coating layers: 40 nm), the proportion of the surface coating layer to Magnetic Core Particles [A] was 25% by mass (total proportion of the coating layers: 25% by mass), and the electric resistance value R was 0.08 Ω. Further, the Vickers hardness (Hv) of the surface coating layer was 58.

PREPARATION EXAMPLE 5 OF CONDUCTIVE PARTICLES

Conductive particles were prepared in the same manner as in Preparation Example 1 of conductive particles except that the treating conditions of the electroless plating with gold were changed, and the electroplating with the gold-cobalt alloy was not conducted. The conductive particles hereinafter be referred to as "Conductive Particles [A5]".

Conductive Particles [A5] thus obtained were such that the number average particle diameter was 8.9 μm, the BET specific surface area of $0.37 \times 10^3$ m$^2$/kg, the thickness of the coating layer was 42 nm, the proportion of the coating layer to Magnetic Core Particles [A] was 26% by mass, and the electric resistance value R was 0.04 Ω. Further, the Vickers hardness (Hv) of the coating layer was 20.

PREPARATION EXAMPLE 6 OF CONDUCTIVE PARTICLES

Conductive particles were prepared in the same manner as in Preparation Example 1 of conductive particles except that Magnetic Core Particles [B] were used in place of Magnetic Core Particles [A], the treating conditions of the electroless plating with gold were changed, the treating conditions of the electroplating with the gold-cobalt alloy were changed, and in the classification treatment of the conductive particles, sieves respectively having opening diameters of 50 μm and 32 μm were superimposed on each other in this order from above in place of the sieves respectively having opening diameters of 20 μm, 16 μm and 10 μm to collect conductive particles captured on the sieve having the opening diameter of 32 μm. The conductive particles will hereinafter be referred to as "Conductive Particles [B1]".

Conductive Particles [B1] thus obtained were such that the number average particle diameter was 32.8 μm, the BET specific surface area of $0.12 \times 10^3$ m$^2$/kg, the thickness of the intermediate coating layer was 48 nm, the thickness of the surface coating layer was 5.5 nm (total thickness of the coating layers: 54 nm), the proportion of the intermediate coating layer to Magnetic Core Particles [B] was 15% by mass, the proportion of the surface coating layer to Magnetic Core Particles [B] was 2% by mass (total proportion of the coating layers: 17% by mass), and the electric resistance value R was 0.03 Ω. Further, the Vickers hardness (Hv) of the intermediate coating layer was 20, and the Vickers hardness (Hv) of the surface coating layer was 200.

PREPARATION EXAMPLE 7 OF CONDUCTIVE PARTICLES

Conductive particles were prepared in the same manner as in Preparation Example 6 of conductive particles except that the treating conditions of the electroless plating with gold were changed, and the electroplating with the gold-cobalt alloy was not conducted. The conductive particles will hereinafter be referred to as "Conductive Particles [B2]".

Conductive Particles [B2] thus obtained were such that the number average particle diameter was 32 μm, the BET specific surface area of $0.14 \times 10^3$ m$^2$/kg, the thickness of the surface coating layer was 48 nm (total thickness of the coating layers: 48 nm), the proportion of the surface coating layer to Magnetic Core Particles [B] was 15% by mass (total proportion of the coating layers: 15% by mass), and the electric resistance value R was 0.03 Ω. Further, the Vickers hardness (Hv) of the surface coating layer was 20.

The properties of Conductive Particles [A1] to Conductive Particles [A5], and Conductive Particles [B1] and Conductive Particles [B2] are shown collectively in the following Table 1.

TABLE 1

| Conductive Particles | Number Average Particle Diameter (μm) | BET Specific Surface area (m²/kg) | Intermediate Coating Layer | | | | Surface Coating Layer | | | | Electric Resistance R (Ω) |
|---|---|---|---|---|---|---|---|---|---|---|---|
| | | | Material | Vickers Hardness | Thickness (nm) | Proportion to Magnetic Core Particles (Mass %) | Material | Vickers Hardness | Thickness (nm) | Proportion to Magnetic Core Particles (Mass %) | |
| [A1] | 8.8 | 0.38 × 10³ | Au | 20 | 42 | 27 | Au—Co | 200 | 11 | 9 | 0.05 |
| [A2] | 8.9 | 0.37 × 10³ | Au | 21 | 40 | 26 | Rh | 800 | 11 | 6 | 0.07 |
| [A3] | 9.1 | 0.35 × 10³ | Ag | 24 | 37 | 15 | Rh | 800 | 20 | 10 | 0.08 |
| [A4] | 8.8 | 0.38 × 10³ | — | — | — | — | Au—Pd | 58 | 40 | 25 | 0.08 |
| [A5] | 8.9 | 0.37 × 10³ | — | — | — | — | Au | 20 | 42 | 26 | 0.04 |
| [B1] | 32.8 | 0.12 × 10³ | Au | 20 | 48 | 15 | Au—Co | 200 | 5.5 | 2 | 0.03 |
| [B2] | 32.0 | 0.14 × 10³ | — | — | — | — | Au | 20 | 48 | 15 | 0.03 |

[Production of Wafer for Test]

Figure 18:
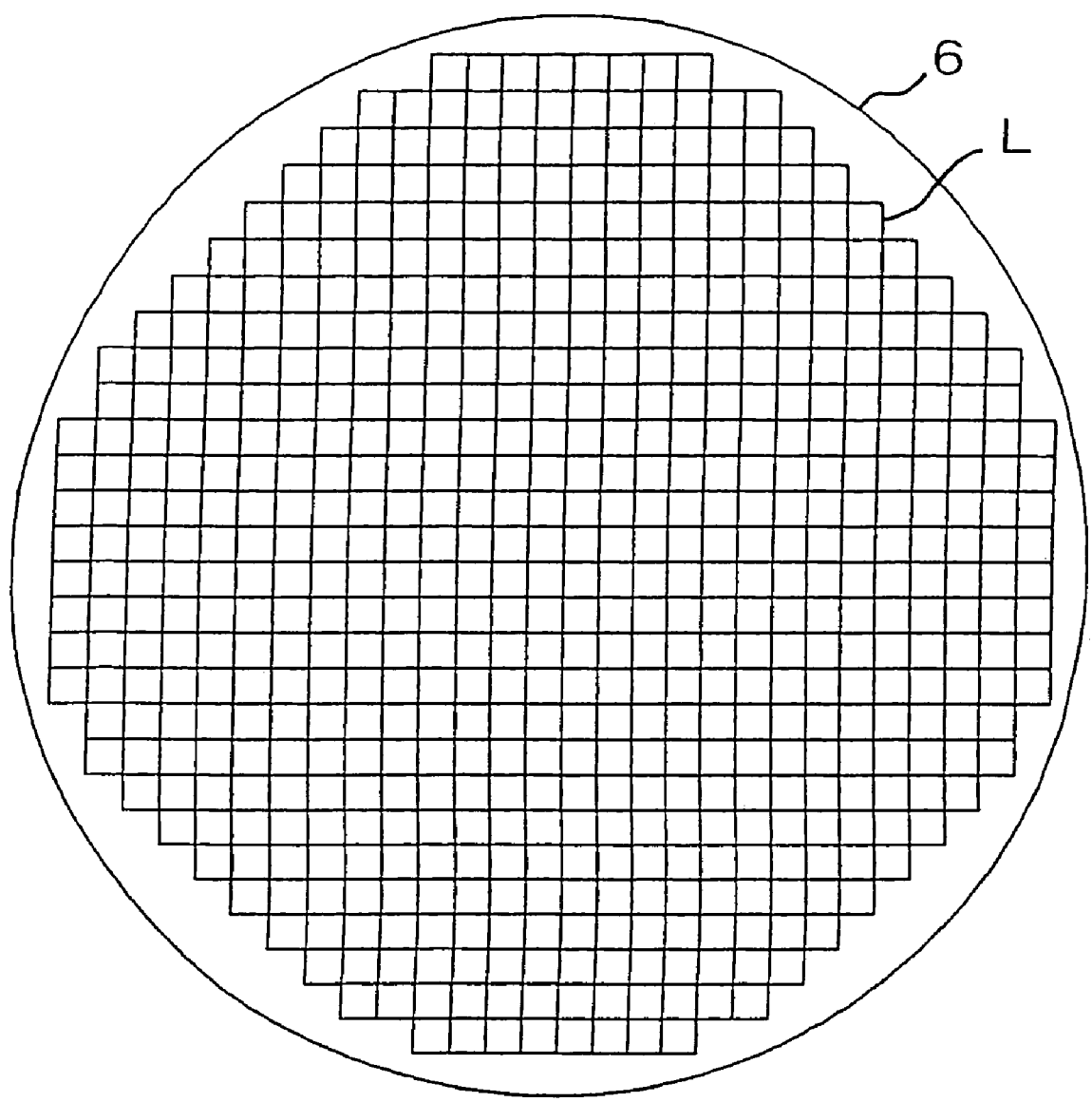
FIG. 18 is a top view of a wafer for test used in Examples.
Figure 19:
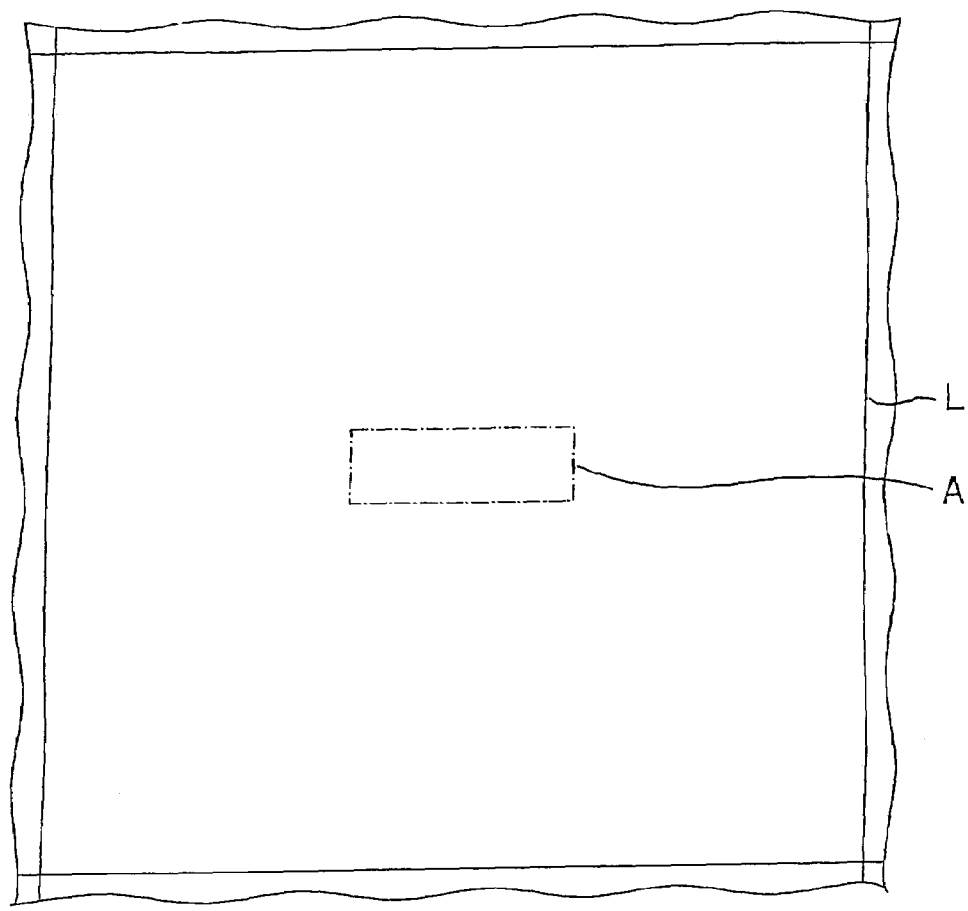
FIG. 19 illustrates a position of a region of electrodes to be inspected in an integrated circuit formed on the wafer for test shown in FIG. 18.
Figure 20:
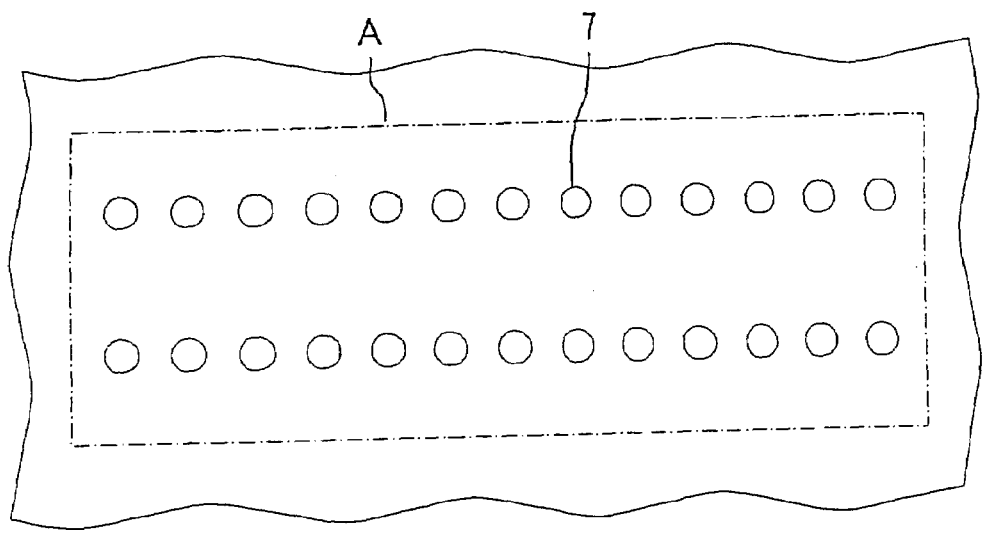
FIG. 20 illustrates the electrodes to be inspected in the integrated circuit formed on the wafer for test shown in FIG. 18.

Wafer W1 for Test:

As illustrated in FIG. 18, 596 square integrated circuits L in total, which each had dimensions of 6.5 mm×6.5 mm, were formed on a wafer 6 made of silicon (coefficient of linear thermal expansion: $3.3×10^{-6}$/K) and having a diameter of 8 inches. Each of the integrated circuits L formed on the wafer 6 has a region A of electrodes to be inspected at its center as illustrated in FIG. 19. In the region A of the electrodes to be inspected, as illustrated in FIG. 20, 26 semi-spherical solder-made electrodes 7 to be inspected each having a diameter of 80 μm and a height of 60 μm are arranged at a pitch of 120 μm in 2 lines (the number of electrodes 7 to be inspected in a line: 13) in the lateral direction. A clearance between electrodes 7 to be inspected adjoining in the vertical direction is 450 μm. Every two electrodes among the 26 electrodes 7 to be inspected are electrically connected to each other. The total number of the electrodes 7 to be inspected in the whole wafer 6 is 15,496. This wafer will hereinafter be referred to as "Wafer W1 for test".

Wafer W2 for Test:

On a wafer made of silicon (coefficient of linear thermal expansion: $3.3×10^{-6}$/K) and having a diameter of 8 inches were formed 596 integrated circuits of the same construction as in Wafer W1 for test except that the electrodes to be inspected were rectangular flat plate-like electrodes made of gold and having dimensions of 70 μm×220 μm. This wafer will hereinafter be referred to as "Wafer W2 for test".

Wafer W3 for Test:

On a wafer made of silicon (coefficient of linear thermal expansion: $3.3×10^{-6}$/K) and having a diameter of 8 inches were formed 286 rectangular integrated circuits L in total, which each had dimensions of 13.0 mm×6.2 mm. Each of the integrated circuits formed on the wafer has a region of electrodes to be inspected, in which 78 semi-spherical solder-made electrodes to be inspected each having a diameter of 450 μm and a height of 350 μm are arranged at a pitch of 800 μm in vertical and lateral directions (6 electrodes in the vertical direction and 13 electrodes in the lateral direction). Every two electrodes among the 78 electrodes 7 to be inspected are electrically connected to each other. This wafer will hereinafter be referred to as "Wafer W3 for test".

EXAMPLE 1

Figure 21:
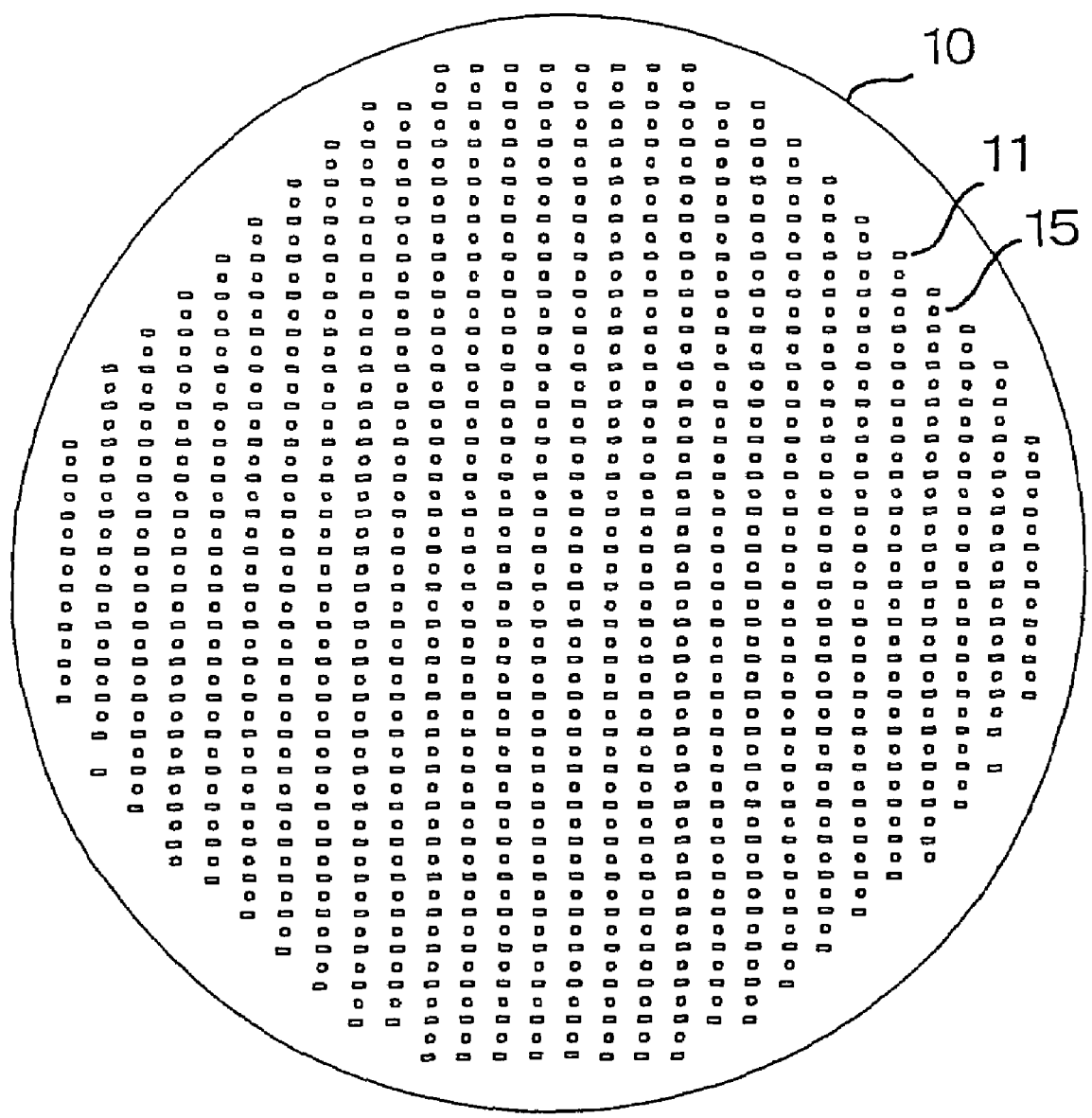
FIG. 21 is a top view of a frame plate produced in Example 1.
Figure 22:
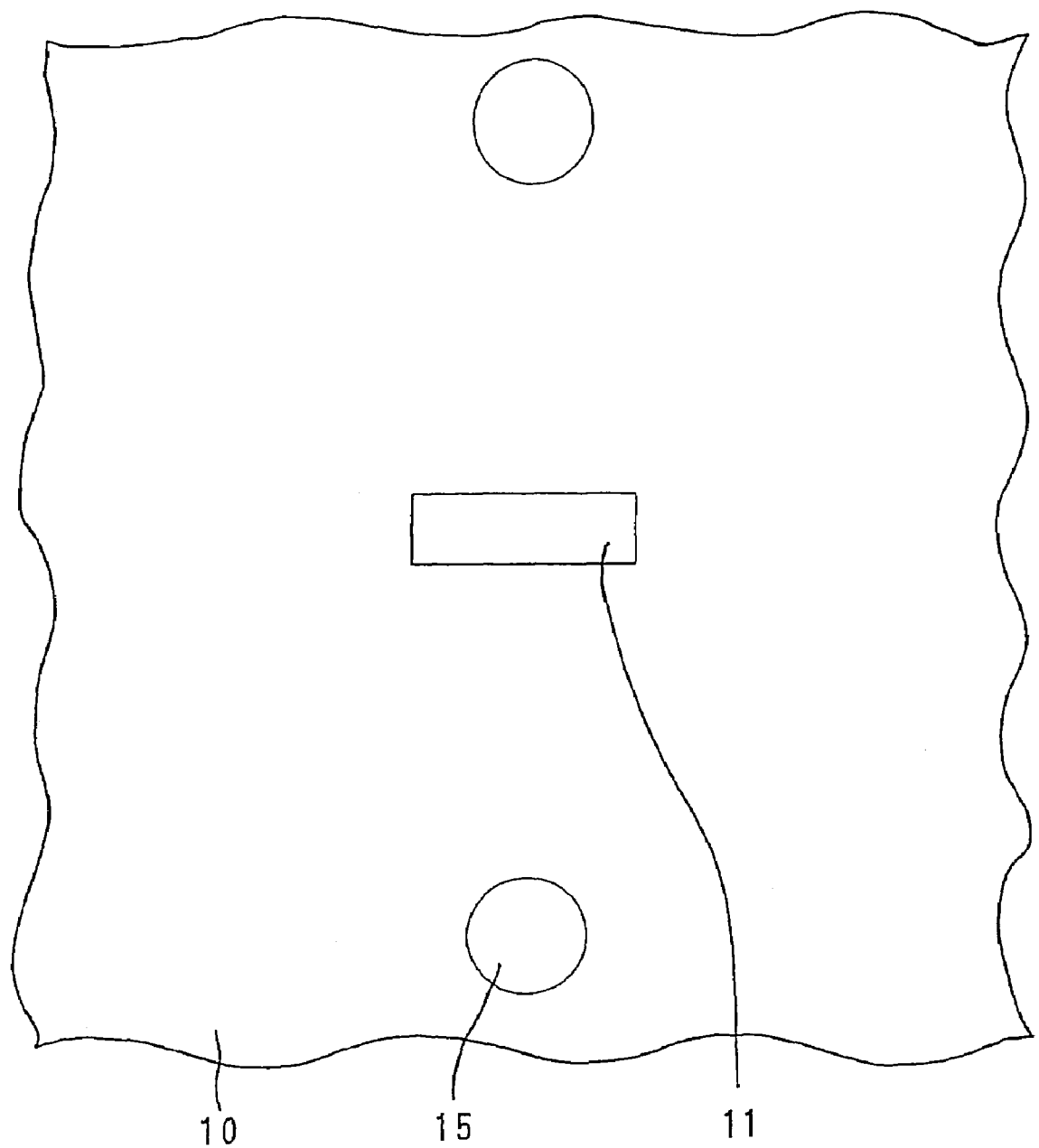
FIG. 22 illustrates, on an enlarged scale, a part of the frame plate shown in FIG. 21.

(1) Frame Plate:

A frame plate having a diameter of 8 inches and 596 anisotropically conductive film-arranging holes formed corresponding to each of the regions of the electrodes to be inspected in Wafer W1 for test described above was produced under the following conditions in accordance with the construction shown in FIGS. 21 and 22.

A material of this frame plate 10 is covar (saturation magnetization: 1.4 Wb/m²; coefficient of linear thermal expansion: $5×10^{-6}$/K), and the thickness thereof is 60 μm.

The anisotropically conductive film-arranging holes 11 each have dimensions of 1,800 μm in a lateral direction (left and right direction in FIGS. 21 and 22) and 600 μm in a vertical direction (upper and lower direction in FIGS. 21 and 22).

A circular air circulating hole 15 is formed at a central position between anisotropically conductive film-arranging holes 11 adjoining in the vertical direction, and the diameter thereof is 1,000 Mμ.

(2) Spacer:

Two spacers for molding elastic anisotropically conductive films, which each have a plurality of through-holes formed corresponding to the regions of the electrodes to be inspected in Wafer W1 for test, were produced under the following conditions.

A material of these spacers is stainless steel (SUS304), and the thickness thereof is 20 μm.

The through-hole corresponding to each region of the electrodes to be inspected has dimensions of 2,500 μm in the lateral direction and 1,400 μm in the vertical direction.

Figure 23:
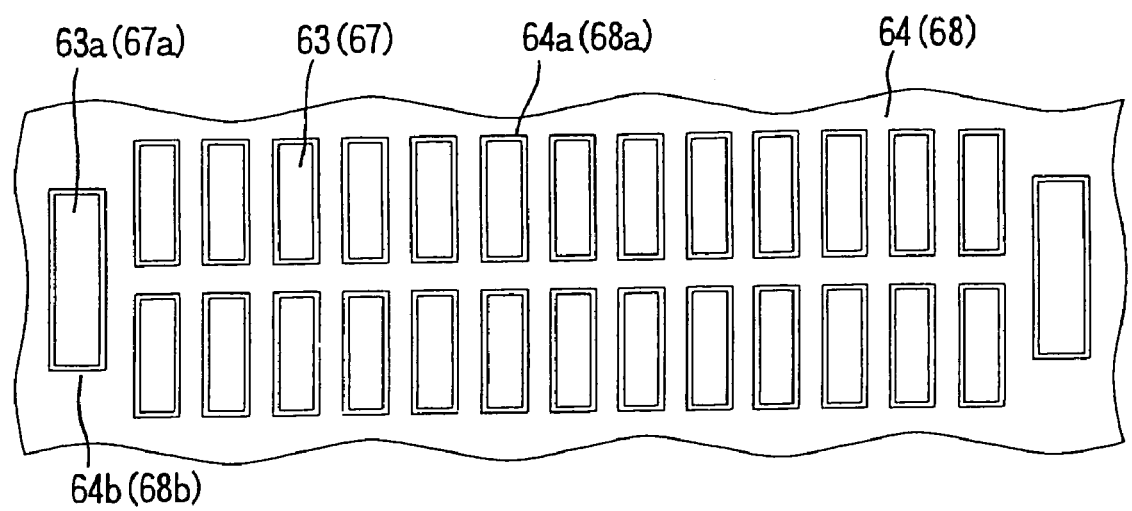
FIG. 23 illustrates, on an enlarged scale, a molding surface of a mold produced in Example 1.

(3) Mold:

A mold for molding elastic anisotropically conductive films was produced under the following conditions in accordance with the construction shown in FIGS. 7 and 23.

A top force 61 and a bottom force 65 in this mold respectively have base plates 62 and 66 made of iron and each having a thickness of 6 mm. On the base plate 62, 66, ferromagnetic substance layers 63 (67) for forming conductive parts for connection and ferromagnetic substance layers 63a (67a) for forming conductive parts for non-connection, which are made of nickel, are arranged in accordance with a pattern corresponding to a pattern of the electrodes to be inspected in Wafer W1 for test. More specifically, the dimensions of each of the ferromagnetic substance layers 63 (67) for forming conductive parts for connection are 60 μm (lateral direction)×200 μm (vertical direction)×100 μm (thickness), and 26 ferromagnetic substance layers 63 (67) are arranged at a pitch of 120 μm in 2 lines (the number of ferromagnetic substance layers 63 (67) in a line: 13; clearance between ferromagnetic substance layers 63 (67) adjoining in the vertical direction: 450 μm) in the lateral direction. The ferromagnetic substance layers 63a (67a) for forming conductive parts for non-connection are arranged outside the ferromagnetic substance layers 63 (67) located most outside in a direction that the ferromagnetic substance layers 63 (67) are arranged. The dimensions of each of the ferromagnetic substance layers 63a (67a) are 80 μm (lateral direction)×300 μm (vertical direction)×100 μm (thickness).

Corresponding to the regions of the electrodes to be inspected in Wafer W1 for test, are formed 596 regions in total, in each of which 26 ferromagnetic substance layers 63 (67) for forming conductive parts for connection and 2 ferromagnetic substance layers 63a (67a) for forming conductive parts for non-connection have been formed. On the whole base plate, are formed 15,496 ferromagnetic substance layers 63 (67) for forming conductive parts for connection and 1,192 ferromagnetic substance layers 63a (67a) for forming conductive parts for non-connection. Non-magnetic substance layers 64 (68) are formed by subjecting dry film resists to a curing treatment. The dimensions of each of recessed parts 64a (68a), at which the ferromagnetic substance layer 63 (67) for forming the conductive part for connection is located, are 70 μm (lateral direction)'210 μm (vertical direction)×30 μm (depth), the dimensions of each of recessed parts 64b (68b), at which the ferromagnetic substance layer 63a (67a) for forming the conductive part for non-connection is located, are 90 μm (lateral direction)×260 μm (vertical direction)×25 μm (depth), and the thickness of other portions than the recessed parts is 75 μm (the thickness of the recessed parts: 50 μm).

(4) Elastic Anisotropically Conductive Film:

The above-described frame plate, spacers and mold were used to form elastic anisotropically conductive films in the frame plate in the following manner.

To and with 100 parts by weight of addition type liquid silicone rubber were added and mixed 30 parts by weight of Conductive Particles [A1]. Thereafter, the resultant mixture was subjected to a defoaming treatment by pressure reduction, thereby preparing a conductive paste composition.

In the above-described process, liquid silicone rubber of a two-pack type that the viscosity of Solution A is 250 Pa·s, the viscosity of Solution B is 250 Pa·s, the compression set of a cured product thereof at 150° C. is 5%, the durometer A hardness of the cured product is 32, and the tear strength of the cured product is 25 kN/m was used as the addition type liquid silicone rubber.

The conductive paste composition prepared as a molding material for elastic anisotropically conductive films was applied to the surfaces of the top force and bottom force of the mold by screen printing, thereby forming molding material layers in accordance with a pattern of elastic anisotropically conductive films to be formed, and the frame plate was superimposed in alignment on the molding surface of the bottom force through the spacer on the side of the bottom force. Further, the top force was superimposed in alignment on the frame plate through the spacer on the side of the top force.

The molding material layers formed between the top force and the bottom force were subjected to a curing treatment under conditions of 100° C. for 1 hour while applying a magnetic field of 2 T to portions located between the corresponding ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C1".

The elastic anisotropically conductive films thus obtained will be described specifically. Each of the elastic anisotropically conductive films has dimensions of 2,500 μm in the lateral direction and 1,400 μm in the vertical direction. In a functional part in each of the elastic anisotropically conductive films, 26 conductive parts for connection are arranged at a pitch of 120 μm in 2 lines (the number of conductive parts for connection in a line: 13; clearance between conductive parts for connection adjoining in the vertical direction: 450 μm) in the lateral direction. The dimensions of each of the conductive parts for connection are 60 μm in the lateral direction, 200 μm in the vertical direction and 160 μm in thickness. The thickness of the insulating part in the functional part is 100 μm. Conductive parts for non-connection are arranged between the conductive parts for connection located most outside in the lateral direction and the frame plate. The dimensions of each of the conductive parts for non-connection are 80 μm in the lateral direction, 300 μm in the vertical direction and 100 μm in thickness. The thickness (thickness of one of the forked portions) of the part to be supported in each of the elastic anisotropically conductive films is 20 μm.

The content of the conductive particles in the conductive parts for connection in each of the elastic anisotropically conductive films of Anisotropically Conductive Connector C1 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

EXAMPLE 2

An anisotropically conductive connector was produced in the same manner as in Example 1 except that Conductive Particles [A2] were used in place of Conductive Particles [A1]. This anisotropically conductive connector will hereinafter be referred to as "Anisotropically Conductive Connector C2".

The content of the conductive particles in the conductive parts for connection in each of the elastic anisotropically conductive films of Anisotropically Conductive Connector C2 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

EXAMPLE 3

An anisotropically conductive connector was produced in the same manner as in Example 1 except that Conductive Particles [A3] were used in place of Conductive Particles [A1]. This anisotropically conductive connector will hereinafter be referred to as "Anisotropically Conductive Connector C3".

The content of the conductive particles in the conductive parts for connection in each of the elastic anisotropically conductive films of Anisotropically Conductive Connector C3 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

EXAMPLE 4

An anisotropically conductive connector was produced in the same manner as in Example 1 except that Conductive Particles [A4] were used in place of Conductive Particles [A1]. This anisotropically conductive connector will hereinafter be referred to as "Anisotropically Conductive Connector C4".

The content of the conductive particles in the conductive parts for connection in each of the elastic anisotropically conductive films of Anisotropically Conductive, Connector C4 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

EXAMPLE 5

Figure 24:
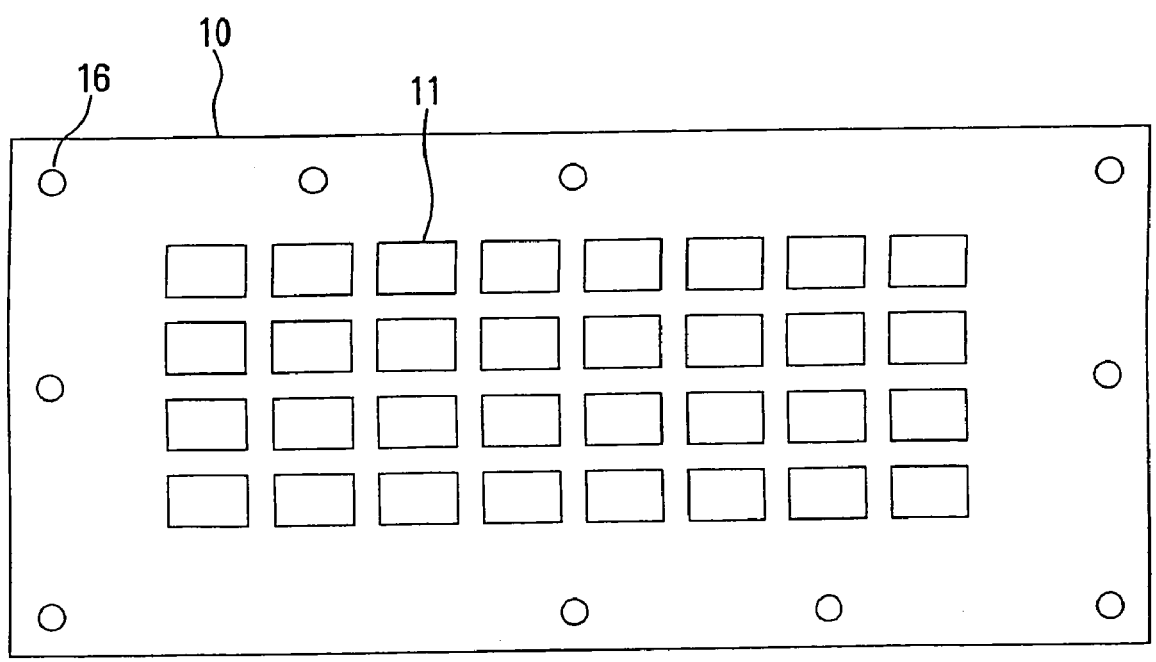
FIG. 24 is a top view of a frame plate produced in Example 5.

(1) Frame Plate:

A frame plate having 32 anisotropically conductive film-arranging holes formed corresponding to the regions of the electrodes to be inspected in Wafer W3 for test described above was produced under the following conditions in accordance with the construction shown in FIG. 24.

A material of this frame plate 10 is 42 alloy (saturation magnetization: 1.45 Wb/m$^2$; coefficient of linear thermal expansion: 5×10$^{-6}$/K), and, the frame plate is a rectangular plate having a vertical and lateral dimension of 133.5 mm×54.8 mm and the thickness thereof is 150 μm.

In this frame plate 10, the 32 anisotropically conductive film-arranging holes 11 each having dimensions of 11.2 mm in a lateral direction (left and right direction in FIG. 24) and 5.6 mm in a vertical direction (upper and lower direction in FIG. 24) are formed corresponding to a pattern of a part of integrated circuits in Wafer W3 for test so as to align in vertical and lateral directions (4 electrodes in the vertical direction and 8 electrodes in the lateral direction).

In addition, 10 positioning holes 16 in total are formed in a peripheral edge part of this frame plate 10, and the diameter of each of the holes is 3.0 mm.

(2) Spacer:

Two spacers for molding elastic anisotropically conductive films, which each have a plurality of through-holes formed corresponding to the regions of the electrodes to be inspected in Wafer W3 for test, were produced under the following conditions.

A material of these spacers is stainless steel (SUS304), and the thickness thereof is 30 μm.

The through-hole corresponding to each region of the electrodes to be inspected has dimensions of 104.1 mm in the lateral direction and 26.4 mm in the vertical direction.

Figure 25:
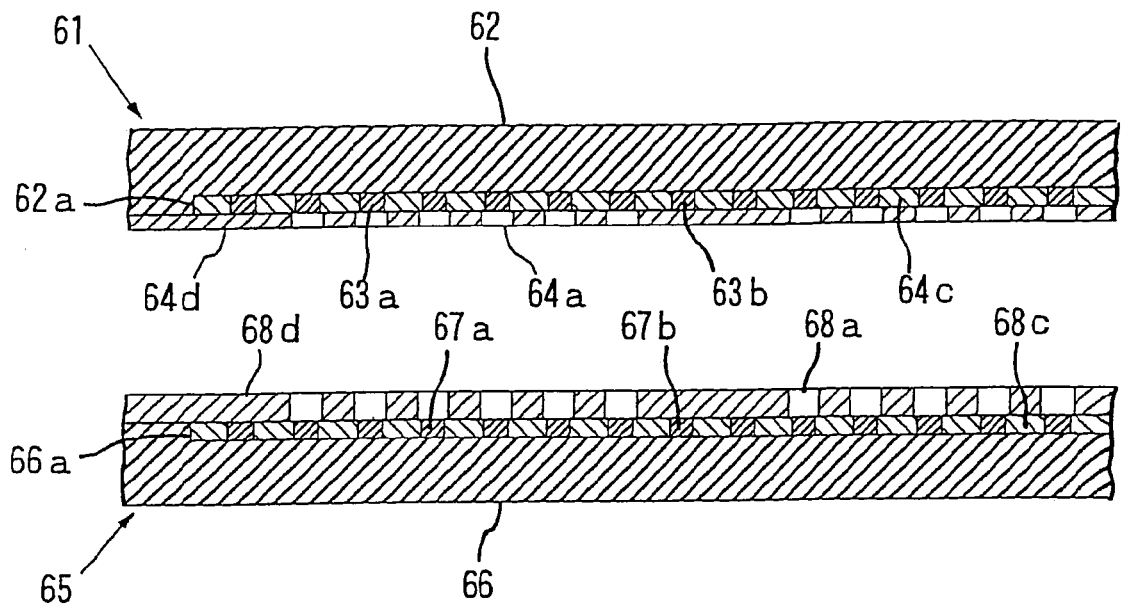
FIG. 25 is a cross-sectional view illustrating, on an enlarged scale, a part of a mold produced in Example 5.
Figure 26:
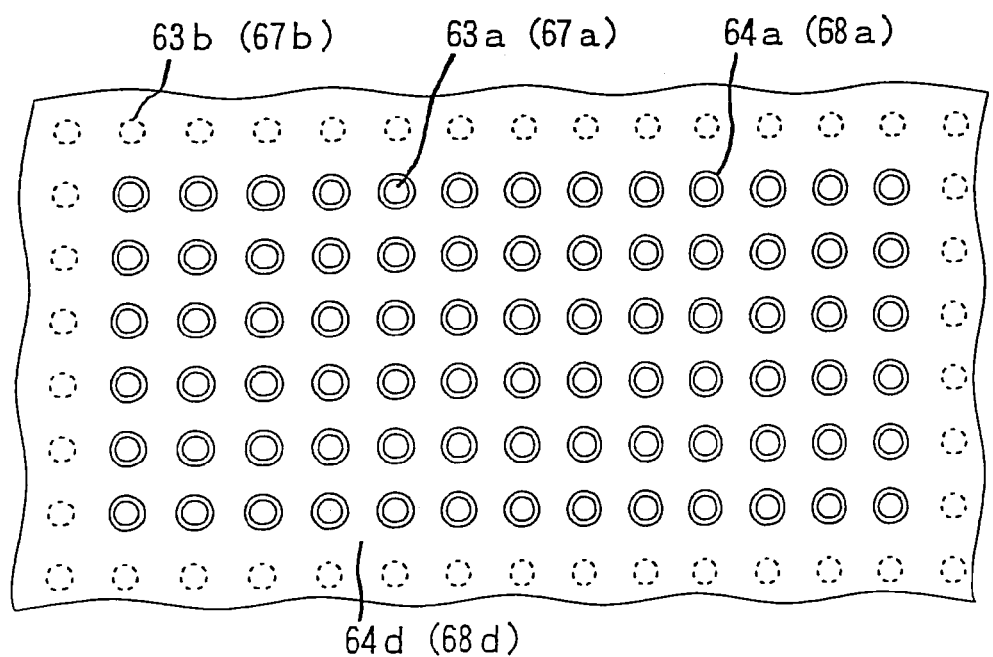
FIG. 26 illustrates, on an enlarged scale, a molding surface of the mold produced in Example 5.

(3) Mold:

A mold for molding elastic anisotropically conductive films was produced under the following conditions in accordance with the construction shown in FIGS. 25 and 26.

A top force 61 and a bottom force 65 in this mold respectively have base plates 62 and 66 made of iron and each having a thickness of 6 plurality of recessed parts 62a and 66a have been respectively formed corresponding to a part of the integrated circuits in Wafer W3 for test. In the recessed parts of the base plate 62, 66, are formed ferromagnetic substance layers 63a, 67a for forming conductive parts for connection, which are arranged in accordance with a pattern corresponding to a pattern of the electrodes to be inspected in a part of the integrated circuits of Wafer W3 for test, and a plurality of ferromagnetic substance layers 63b, 67b for forming conductive parts for non-connection, which are arranged so as to surround the plurality of the ferromagnetic substance layers 63a, 67a for forming conductive parts for connection corresponding to the on the surfaces of which a electrodes to be inspected in a part of the integrated circuits of Wafer W3 for test. These base plates 62 and 66, and the ferromagnetic substance layers 63b, 67a and 67b are formed by etching a base material. Thus, the ferromagnetic substance layers 63, 63a, 63b, 67a and 67b are formed continuously and integrally with the base plates 62 and 66, respectively, and a material thereof is iron.

The ferromagnetic substance layers 63a, 67a corresponding to the electrodes to be inspected in an integrated circuit of Wafer W3 for test will be described. The dimensions of each of the ferromagnetic substance layers 63a, 67a for forming conductive parts for connection are 350 μm (diameter)×150 μm (thickness), and 78 ferromagnetic substance layers 63a, 67a are arranged at a pitch of 800 μm in 6 lines (the number of ferromagnetic substance layers 63a, 67a in a line: 13) in the lateral direction. Around the 78 ferromagnetic substance layers 63a, 67a, 42 ferromagnetic substance layers 63b, 67b for forming conductive parts for non-connection are arranged at a pitch 20 of 800 μm.

Corresponding to the 32 regions of the electrodes to be inspected in the integrated circuits L of Wafer W3 for test, are formed 32 regions in total, in each of which the 78 ferromagnetic substance layers 63a, 67a for forming conductive parts for connection and the 42 ferromagnetic substance layers 63b, 67b for forming conductive parts for non-connection have been formed.

First non-magnetic substance layers 64c, 68c formed by subjecting a liquid resin to a curing treatment are provided between the respective ferromagnetic substance layers 63, 63a, 67, 67a in the recessed parts 62a, 66a of the base plates 62, 66, and second non-magnetic substance layers 64d, 68d formed by subjecting a dry film resist to a curing treatment are provided at other portions than the recessed parts 62a, 66a in the surfaces of the base plates 62, 66 and on the surfaces of the first non-magnetic substance layers 64c, 68c and the surfaces of the ferromagnetic substance layers 63a, 67a for forming conductive parts for non-connection, whereby recessed parts 64a, 68a are formed at portions on which the ferromagnetic substance layers 63a, 67a for forming conductive parts for connection are located. On the other hand, no recessed part is formed at portions on which the ferromagnetic substance layers 63b, 67b for forming conductive parts for non-connection are located. The dimensions of each of the recessed parts 64a in the top force 61 are 380 µm (diameter)×30 µm (depth), and the dimensions of each of the recessed parts 68a in the bottom force 65 are 380 µm (diameter)×100 µm (depth).

(4) Elastic Anisotropically Conductive Film:

The above-described frame plate, spacers and mold were used to form elastic anisotropically conductive films in the frame plate in the following manner.

To and with 100 parts by weight of addition type liquid silicone rubber were added and mixed 67 parts by weight of Conductive Particles [B1]. Thereafter, the resultant mixture was subjected to a defoaming treatment by pressure reduction, thereby preparing a conductive paste composition.

In the above-described process, liquid silicone rubber of a two-pack type that the viscosity of Solution A is 250 Pa·s, the viscosity of Solution B is 250 Pa·s, the compression set of a cured product thereof at 150° C. is 5%, the durometer A hardness of the cured product is 32, and the tear strength of the cured product is 25 kN/m was used as the addition type liquid silicone rubber.

The conductive paste composition prepared as a molding material for elastic anisotropically conductive films was applied to the surfaces of the top force and bottom force of the mold by screen printing, thereby forming molding material layers in accordance with a pattern of elastic anisotropically conductive films to be formed, and the frame plate was superimposed in alignment on the molding surface of the bottom force through the spacer on the side of the bottom force. Further, the top force was superimposed in alignment on the frame plate through the spacer on the side of the top force.

The molding material layers formed between the top force and the bottom force were subjected to a curing treatment under conditions of 100° C. for 1 hour while applying a magnetic field of 2 T to portions located between the ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C5".

The elastic anisotropically conductive films thus obtained will be described specifically. Each of the elastic anisotropically conductive films has dimensions of 104.1 mm in the lateral direction and 26.4 mm in the vertical direction. In a functional part in each of the elastic anisotropically conductive films, 78 conductive parts for connection are arranged at a pitch of 800 µm in 6 lines (the number of conductive parts for connection in a line is 13) in the lateral direction. The dimensions of each of the conductive parts for connection are 380 µm in diameter and 340 µm in thickness. The thickness of the insulating part in the functional part is 210 µm. Conductive parts for non-connection are arranged between the conductive parts for connection and the frame plate, respectively. The dimensions of each of the conductive parts for non-connection are 350 µm in diameter and 210 µm in thickness. The thickness (thickness of one of the forked portions) of the part to be supported in each of the elastic anisotropically conductive films is 30 µm.

The content of the conductive particles in the conductive parts for connection in each of the elastic anisotropically conductive films of Anisotropically Conductive Connector C5 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

COMPARATIVE EXAMPLE 1

An anisotropically conductive connector was produced in the same manner as in Example 1 except that Conductive Particles [A5] were used in place of Conductive Particles [A1]. This anisotropically conductive connector will hereinafter be referred to as "Anisotropically Conductive Connector C6".

The content of the conductive particles in the conductive parts for connection in each of the elastic anisotropically conductive films of Anisotropically Conductive Connector C6 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

COMPARATIVE EXAMPLE 2

An anisotropically conductive connector was produced in the same manner as in Example 5 except that Conductive Particles [B2] were used in place of Conductive Particles [B1]. This anisotropically conductive connector will hereinafter be referred to as "Anisotropically Conductive Connector C7".

The content of the conductive particles in the conductive parts for connection in each of the elastic anisotropically conductive films of Anisotropically Conductive Connector C7 thus obtained was investigated. As a result, the content was about 30% in terms of a volume fraction in all the conductive parts for connection.

The part to be supported and the insulating part in the functional part of the elastic anisotropically conductive film were observed. As a result, it was confirmed that the conductive particles are present in the part to be supported and that the conductive particles are scarcely present in the insulating part in the functional part.

[Evaluation of Anisotropically Conductive Connector]

(1) Production of Circuit Board for Inspection:

Alumina ceramic (coefficient of linear thermal expansion: $4.8 \times 10^{-6}$/K) was used as a base material to produce a circuit board for inspection, in which inspection electrodes had been formed in accordance with a pattern corresponding to the pattern of the electrodes to be inspected in Wafer W1 for test. This circuit board for inspection has dimensions of 30 cm×30 cm as a whole and is rectangular. The inspection electrodes thereof each have dimensions of 60 µm in the lateral direction and 200 µm in the vertical direction, and the surfaces thereof are plated with gold. This circuit board for inspection will hereinafter be referred to as "Circuit Board Ti for inspection".

Further, alumina ceramic (coefficient of linear thermal expansion: $4.8 \times 10^{-6}$/K) was used as a base material to produce a circuit board for inspection, in which inspection electrodes had been formed in accordance with a pattern corresponding to the pattern of the electrodes to be inspected of the 32 (4×8) integrated circuits in Wafer W3 for test. This circuit board for inspection has dimensions of 140 mm×60 mm as a whole and is rectangular. The inspection electrodes thereof each have a diameter of 450 μm and is circular, and the surfaces thereof are plated with gold. This circuit board for inspection will hereinafter be referred to as "Circuit Board T2 for inspection".

(2) Test 1:

The following test was conducted as to Anisotropically Conductive Connector C1 according to Example 1, Anisotropically Conductive Connector C2 according to Example 2 and Anisotropically Conductive Connector C6 according to Comparative Example 1.

Wafer W1 for test was arranged on a test table equipped with an electric heater, and an anisotropically conductive connector was arranged on this Wafer W1 for test in alignment in such a manner that the conductive parts for connection thereof are located on the respective electrodes to be inspected of Wafer W1 for test. Circuit Board T for inspection was arranged on this anisotropically conductive connector in alignment in such a manner that the inspection electrodes thereof are located on the respective conductive parts for connection of the anisotropically conductive connector. Further, Circuit Board T for inspection was pressurized downward for 1 minute under a load of 150 kg (load applied to every conductive part for connection: about 10 g on the average) An electric resistance between 2 inspection electrodes electrically connected to each other through the anisotropically conductive connector and Wafer W1 for test among the 15,496 inspection electrodes in Circuit Board T for inspection was successively measured at room temperature (25° C.), and an electric resistance value of a circuit of Wafer W1 for test, which had been measured in advance, was subtracted from the electric resistance value measured to measure a half of the value thus obtained as an electric resistance (hereinafter referred to as "conduction resistance") of the conductive part for connection in the anisotropically conductive connector. The above-described process is referred to as "Process (i)". The pressure against the Circuit Board T for inspection was then released, and the anisotropically conductive connector was left to stand for 15 second in this non-pressurized state. The above-described process is referred to as "Process (ii)". The above-described Processes (i) and (ii) were regarded as a cycle, and this cycle was continuously repeated to determine the number of cycles until the conduction resistance value measured in Process (i) exceeded 1 Ω.

In the above-described test, those that the conduction resistance of the conductive parts for connection is 1 Ω or higher are difficult to be actually used in electrical inspection of integrated circuits formed on a wafer.

The results are shown in the following Table 2.

TABLE 2

|  | type of conductive particles | number of cycles until conduction resistance exceeded 1 Ω |
|---|---|---|
| Example 1 | conductive [A1] particles | 60.000 |
| Example 2 | conductive [A2] particles | 80.000 |
| Comparative example 1 | conductive [A5] particles | 25.000 |

(3) Test 2:

The number of cycles until the conduction resistance value of the conductive part for connection in the anisotropically conductive connector exceeded 1 Ω was determined as to Anisotropically Conductive Connector C1 according to Example 1, Anisotropically Conductive Connector C2 according to Example 2 and Anisotropically Conductive Connector C6 according to Comparative Example 1 in the same manner as in Test 1 except that Wafer W2 for test was used in place of Wafer W1 for test. The results are shown in the following Table 3.

TABLE 3

|  | type of conductive particles | number of cycles until conduction resistance exceeded 1 Ω |
|---|---|---|
| Example 1 | conductive [A1] particles | 58.000 |
| Example 2 | conductive [A2] particles | 55.000 |
| Comparative example 1 | conductive [A5] particles | 25.000 |

(4) Test 3:

The following test was conducted as to Anisotropically Conductive Connector C5 according to Example 5 and Anisotropically Conductive Connector C7 according to Comparative Example 2.

Wafer W3 for test was arranged on a test table equipped with an electric heater, and an anisotropically conductive connector was arranged on the region, in which the adjoining 32 (4×8) integrated circuit among the integrated circuit formed on this Wafer W3 for test had been formed, in alignment in such a manner that the conductive parts for connection thereof are located on the respective electrodes to be inspected of Wafer W3 for test. Circuit Board T2 for inspection was arranged on this anisotropically conductive connector in alignment in such a manner that the respective inspection electrodes thereof are located on the respective conductive parts for connection of the anisotropically conductive connector. Further, Circuit Board T2 for inspection was moved downward to pressurize the anisotropically conductive connector, thereby finding a minimum displacement position that the conductive parts for connection of the anisotropically conductive connector conduct. The Circuit Board T2 for inspection was displaced by additional 60 μm from the minimum displacement position, and the anisotropically conductive connector was held for 1 minute in this state. The test table was then heated to 85° C. to measure a conduction resistance of each of the conductive part for connection in the anisotropically conductive connector. The above-described process is referred to as "Process (i)". The pressure against the Circuit Board T2 for inspection was then released, and the anisotropically conductive connector was left to stand for 15 second in this non-pressurized state. The above-described process is referred to as "Process (ii)". The above-described Processes (i) and (ii) were regarded as a cycle, and this cycle was continuously repeated to determine the number of cycles until the conduction resistance value measured in Process (i) exceeded 1 Ω.

In this Test 3, the integrated circuits subjected to the test in Wafer W3 for test were changed every 3,000 cycles. After all the integrated circuit of Wafer W3 for test were tested, Wafer W3 for test was changed to new one to continue Test 3.

In the above-described test, those that the conduction resistance of the conductive parts for connection is 1 Ω or higher are difficult to be actually used in electrical inspection of integrated circuits formed on a wafer.

The results are shown in the following Table 4.

TABLE 4

|  | type of conductive particles | number of cycles until conduction resistance exceeded 1 Ω |
| --- | --- | --- |
| Example 5 | conductive [B1] particles | 52.000 |
| Comparative example 2 | conductive [B2] particles | 22.000 |

(5) Test 4:

The following test was conducted as to Anisotropically Conductive Connector C1 to Anisotropically Conductive Connectors C4 according to Examples 1 to 4 and Anisotropically Conductive Connector C6 according to Comparative Example 1.

Wafer W2 for test was arranged on a test table provided in a thermostatic oven, and Anisotropically Conductive Connector C1 was arranged on this Wafer W2 for test in alignment in such a manner that the conductive parts for connection thereof are located on the respective electrodes to be inspected of Wafer W2 for test. Circuit Board T for inspection was arranged on this anisotropically conductive connector in alignment in such a manner that the inspection electrodes thereof are located on the respective conductive parts for connection of this Anisotropically Conductive Connector C1. Further, Circuit Board Ti for inspection was pressurized downward under a load of 150 kg (load applied to every conductive part for connection: about 10 g on the average). The temperature within the thermostatic oven was raised to 125° C., and the circuit board for inspection was pressurized and held for 4 hours under the temperature conditions of 125° C. Thereafter, a conduction resistance of the conductive parts for connection in the anistopically conductive connector was measured. The above-described process is referred to as "Process (i)". After the temperature was lowered to room temperature (30° C. or lower), the pressure against the Circuit Board Ti for inspection was released, and the anisotropically conductive connector was left to stand for 15 second in this non-pressurized state. The above-described process is referred to as "Process (ii)". The above-described Processes (i) and (ii) were regarded as a cycle, and this cycle was continuously repeated to determine the number of cycles until the conduction resistance value measured in Process (i) exceeded 1 Ω.

In the above-described test, those that the conduction resistance of the conductive parts for connection is 1 Ω or higher are difficult to be actually used in electrical inspection of integrated circuits formed on a wafer.

The results are shown in the following Table 5.

TABLE 5

|  | type of conductive particles | number of cycles until conduction resistance exceeded 1 Ω |
| --- | --- | --- |
| Example 1 | conductive [A1] particles | 485 |
| Example 2 | conductive [A2] particles | 465 |
| Example 3 | conductive [A3] particles | 430 |
| Example 4 | conductive [A4] particles | 250 |
| Comparative example 1 | conductive [A5] particles | 180 |

As apparent from the results shown in Table 2 to Table 5, it was confirmed that according to the anisotropically conductive connectors according to Example 1 to Example 5, good conductivity is retained over a long period of time even when electrodes to be inspected are either projected or flat.

The invention claimed is:

1. An anisotropically conductive connector comprising an elastic anisotropically conductive film, in which a plurality of conductive parts for connection containing conductive particles and extending in a thickness-wise direction of the film have been formed,
wherein the conductive particles contained in the conductive parts for connection are obtained by laminating an intermediate coating layer and a surface coating layer each formed of a high-conductive metal on a surface of core particle exhibiting magnetism, and the outermost coating layer is a coating layer having a high hardness and the intermediate coating layer is a coating layer having a lower hardness than the outermost coating layer.

2. The anisotropically conductive connector according to claim 1, wherein the Vickers hardness (HV) of the coating layer having the high hardness is at least 40.

3. The anisotropically conductive connector according to claim 2, wherein the coating layer having the Vickers hardness (Hv) of at least 40 in the conductive particles is formed of at least 2 high-conductive metals.

4. The anisotropically conductive connector according to claim 3, wherein the coating layer having the Vickers hardness (Hv) of at least 40 in the conductive particles is formed of gold and another high-conductive metal.

5. The anisotropically conductive connector according to claim 3, wherein the coating layer having the Vickers hardness (Hv) of at least 40 in the conductive particles is formed by a sputtering method using an alloy composed of at least 2 high-conductive metals as a target.

6. The anisotropically conductive connector according to claim 3, wherein the coating layer having the Vickers hardness (Hv) of at least 40 in the conductive particles is formed by a plating treatment with a plating solution containing at least 2 high-conductive metal components.

7. The anisotropically conductive connector according to claim 1, which has a frame plate, in which an anisotropically conductive film-arranging hole extending through in a thickness-wise direction has been formed, and the elastic anisotropically conductive film is arranged in the anisotropically conductive film-arranging hole of this frame plate and supported by the frame plate.

8. The anisotropically conductive connector according to claim 1, which is an anisotropically conductive connector used for conducting electrical inspection of each of a plurality of integrated circuits formed on a wafer in a state of the wafer, and wherein the anisotropically conductive connector comprises a frame plate, in which a plurality of anisotropically conductive film-arranging holes each extending in a thickness-wise direction have been formed corresponding to electrode regions, in which electrodes to be inspected have been formed, in the integrated circuits formed on the wafer, which is an object of inspection, and the elastic anisotropically conductive films are arranged in the respective anisotropically conductive film-arranging holes of this frame plate and supported by the frame plate.

9. A probe member suitable for use in conducting electrical inspection of each of a plurality of integrated circuits formed on a wafer in a state of the wafer, which comprises:

a circuit board for inspection, on the surface of which inspection electrodes have been formed in accordance with a pattern corresponding to a pattern of electrodes to be inspected of the integrated circuits formed on the wafer, which is an object of inspection, and the anisotropically conductive connector according to claim 1, which is arranged on the surface of the circuit board for inspection.

10. The probe member according to claim 9, which is equipped with the anisotropically conductive connector, and wherein the coefficient of linear thermal expansion of the frame plate in the anisotropically conductive connector is at most $3 \times 10^{-5}$/K, and the coefficient of linear thermal expansion of a base material making up the circuit board for inspection is at most $3 \times 10^{-5}$/K.

11. The probe member according to claim 9, wherein a sheet-like connector composed of an insulating sheet and a plurality of electrode structures each extending through in a thickness-wise direction of the insulating sheet and arranged in accordance with a pattern corresponding to the pattern of the electrodes to be inspected is arranged on the anisotropically conductive connector.

12. A wafer inspection apparatus for conducting electrical inspection of each of a plurality of integrated circuits formed on a wafer in a state of the wafer, which comprises:

the probe member according to claim 9, and wherein electrical connection to the integrated circuits formed on the wafer, which is an object of inspection, is achieved through the probe member.

13. A wafer inspection method comprising electrically connecting each of a plurality of integrated circuits formed on a wafer to a tester through the probe member according to claim 9 to perform electrical inspection of the integrated circuits formed on the wafer.

* * * * *